(12) United States Patent
Kim et al.

(10) Patent No.: US 12,213,304 B2
(45) Date of Patent: Jan. 28, 2025

(54) SEMICONDUCTOR DEVICE

(71) Applicant: Samsung Electronics Co., Ltd., Suwon-si (KR)

(72) Inventors: Teawon Kim, Hwaseong-si (KR); Yurim Kim, Hwaseong-si (KR); Seohee Park, Daejeon (KR); Kong-Soo Lee, Hwaseong-si (KR); Yong Suk Tak, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 427 days.

(21) Appl. No.: 17/825,441

(22) Filed: May 26, 2022

(65) Prior Publication Data

US 2023/0134099 A1 May 4, 2023

(30) Foreign Application Priority Data

Nov. 1, 2021 (KR) .................. 10-2021-0148264

(51) Int. Cl.
*H01L 27/108* (2006.01)
*H10B 12/00* (2023.01)

(52) U.S. Cl.
CPC .......... *H10B 12/34* (2023.02); *H10B 12/053* (2023.02); *H10B 12/315* (2023.02)

(58) Field of Classification Search
None
See application file for complete search history.

(56) References Cited

U.S. PATENT DOCUMENTS

| | | | |
|---|---|---|---|
| 7,875,959 B2 | 1/2011 | Ke et al. |
| 9,202,690 B2 | 12/2015 | Lee et al. |
| 9,246,013 B2 | 1/2016 | Ahmed |
| 9,634,082 B2 | 4/2017 | Yamazaki et al. |
| 9,735,281 B2 | 8/2017 | Kim et al. |
| 10,141,425 B2 | 11/2018 | Yamazaki et al. |

(Continued)

FOREIGN PATENT DOCUMENTS

| | | |
|---|---|---|
| KR | 10-2015-0080613 A | 7/2015 |
| TW | 200729497 A | 8/2007 |
| TW | 202119621 A | 5/2021 |

OTHER PUBLICATIONS

Taiwanese Notice of Allowance dated Aug. 15, 2023 issued in corresponding Taiwanese Patent Application No. 111137449.

*Primary Examiner* — Hrayr A Sayadian
(74) *Attorney, Agent, or Firm* — Harness, Dickey & Pierce, P.L.C.

(57) ABSTRACT

A semiconductor device includes: a substrate; a conductive line extending on the substrate in a first horizontal direction; an isolation insulating layer extending on the substrate and the conductive line in a second horizontal direction intersecting with the first horizontal direction, and defining a channel trench extending through the isolation insulating layer from an upper surface of the isolation insulating layer to a lower surface of the isolation insulating layer; a crystalline oxide semiconductor layer extending along at least a portion of an inner side surface of the channel trench and at least a portion of a bottom surface of the channel trench and coming in contact with the conductive line; and a gate electrode extending on the crystalline oxide semiconductor layer inside the channel trench in the second horizontal direction.

20 Claims, 35 Drawing Sheets

(56) References Cited

U.S. PATENT DOCUMENTS

| | | |
|---|---|---|
| 11,342,335 B2 | 5/2022 | Chang |
| 2011/0017990 A1* | 1/2011 | Son .................... H01L 29/7869 |
| | | 257/E29.296 |
| 2014/0014947 A1 | 1/2014 | Yamazaki |
| 2014/0175423 A1 | 6/2014 | Jeong et al. |
| 2015/0179442 A1 | 6/2015 | Lee et al. |
| 2015/0179815 A1 | 6/2015 | Ahmed |
| 2015/0187574 A1 | 7/2015 | Le et al. |
| 2019/0153595 A1 | 5/2019 | Wang |
| 2021/0202755 A1 | 7/2021 | Ok et al. |

* cited by examiner

14AR1

14AR2

SEMICONDUCTOR DEVICE

CROSS-REFERENCE TO RELATED APPLICATION

This application is based on and claims priority under 35 U.S.C. § 119 to Korean Patent Application No. 10-2021-0148264, filed on Nov. 1, 2021, in the Korean Intellectual Property Office, the disclosure of which is incorporated by reference herein in its entirety.

BACKGROUND

The inventive concepts relate to a semiconductor device. More particularly, the inventive concepts relate to a semiconductor device including an oxide semiconductor.

Along with high integration of a semiconductor device, a leakage current characteristic control of the semiconductor device has been significant. To reduce a leakage current of a semiconductor device, research for a channel layer including an oxide semiconductor material has been conducted. The oxide semiconductor material has an excellent leakage current characteristic by having high band gap energy while having an on-current similar to that of silicon (Si).

SUMMARY

The inventive concepts provide a semiconductor device with improved the performance and the reliability from improved electrical characteristics.

To this end, the inventive concepts provide semiconductor devices as follows.

According to an aspect of the inventive concepts, there is provided a semiconductor device including: a substrate; a conductive line extending on the substrate in a first horizontal direction; an isolation insulating layer extending on the substrate and the conductive line in a second horizontal direction intersecting with the first horizontal direction, and defining a channel trench extending through the isolation insulating layer from an upper surface of the isolation insulating layer to a lower surface of the isolation insulating layer; a crystalline oxide semiconductor layer extending along at least a portion of an inner side surface of the channel trench and at least a portion of a bottom surface of the channel trench and contacting the conductive line; and a gate electrode extending on the crystalline oxide semiconductor layer inside the channel trench in the second horizontal direction, wherein, in the crystalline oxide semiconductor layer, a grain size of a first part of the crystalline oxide semiconductor layer adjacent to the inner side surface of the channel trench is greater than a grain size of a second part of the crystalline oxide semiconductor layer adjacent to the bottom surface of the channel trench.

According to another aspect of the inventive concepts, there is provided a semiconductor device including: a substrate; a filling oxide layer on the substrate; a plurality of conductive lines extending in a first horizontal direction with a side surface of each of the plurality of conductive lines covered by the filling oxide layer, and arranged to be separated from each other in a second horizontal direction intersecting with the first horizontal direction; a lower contact layer on the plurality of conductive lines; an isolation insulating layer extending on the filling oxide layer and the lower contact layer in the second horizontal direction intersecting with the first horizontal direction, and defining a channel trench, through a bottom surface of the isolation insulating layer exposing at least a portion of the lower contact layer; a crystalline oxide semiconductor layer extending along at least a portion of an inner side surface of the channel trench and at least a portion of the bottom surface of the channel trench and contacting the plurality of conductive lines; a gate electrode including first gate electrode and second gate electrode separated from the first gate electrode from and facing the first gate electrode on the crystalline oxide semiconductor layer inside the channel trench in the first horizontal direction and the first gate electrode and the second gate electrode extending in the second horizontal direction; an upper contact layer on the crystalline oxide semiconductor layer; and a capacitor structure on the isolation insulating layer and the upper contact layer and contacting an upper surface of the upper contact layer, wherein an upper part of the crystalline oxide semiconductor layer has a larger grain size than a lower part of the crystalline oxide semiconductor layer.

According to another aspect of the inventive concepts, there is provided a semiconductor device including: a substrate; a filling oxide layer on the substrate; a plurality of conductive lines extending in a first horizontal direction with each of the plurality of conductive lines including a side surface covered by the filling oxide layer, and the plurality of conductive lines being arranged by being spaced apart from each other in a second horizontal direction intersecting with the first horizontal direction; a lower contact layer on the plurality of conductive lines; an isolation insulating layer extending on the filling oxide layer and the lower contact layer in the second horizontal direction intersecting with the first horizontal direction, and defining a channel trench, through a bottom surface of the isolation insulating layer and exposing at least a portion of the lower contact layer; a crystalline oxide semiconductor layer extending along at least a portion of an inner side surface of the channel trench and at least a portion of the bottom surface of the channel trench and contacting the plurality of conductive lines; a seed oxide semiconductor layer between the isolation insulating layer and the crystalline oxide semiconductor layer and extending along an outer side surface of the crystalline oxide semiconductor layer; a gate electrode including a first gate electrode and a second gate electrode separated from the first gate electrode and facing the first gate electrode on the crystalline oxide semiconductor layer inside the channel trench in the first horizontal direction and the first gate electrode and the second gate electrode extending in the second horizontal direction; a barrier insulating layer between the first gate electrode and second gate electrode, and a gap-fill insulating layer formed on the barrier insulating layer in a region between the first gate electrode and the second gate electrode; an upper contact layer on the crystalline oxide semiconductor layer; and a capacitor structure on the isolation insulating layer and the upper contact layer and contacts an upper surface of the upper contact layer, wherein a first part of the crystalline oxide semiconductor layer adjacent to the seed oxide semiconductor layer has a larger grain size than a part of the crystalline oxide semiconductor layer adjacent to the barrier insulating layer.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

FIGS. 1A to 1G are cross-sectional views showing a method of forming a crystalline oxide semiconductor layer included in a semiconductor device, according to example embodiments of the inventive concepts.

Figure 1A:
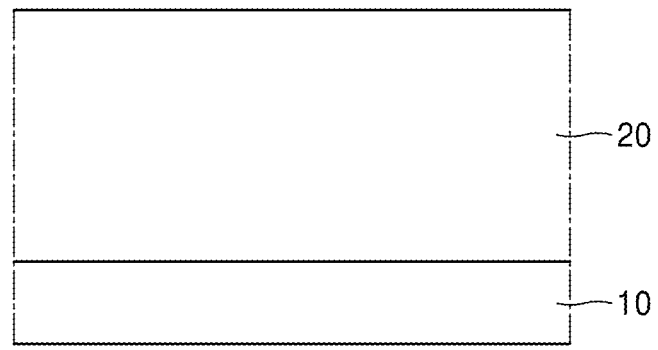
FIGS. 1A to 1G are cross-sectional views showing a method of forming a crystalline oxide semiconductor layer included in a semiconductor device, according to example embodiments of the inventive concepts.

Referring to FIG. 1A, a base insulating layer 20 is formed on a substrate 10. The substrate 10 may include a semiconductor material such as a group IV semiconductor material, a group III-V semiconductor material, or a group II-VI semiconductor material. The group IV semiconductor material may include, for example, silicon (Si), germanium (Ge), or silicon-germanium (Si—Ge). The group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The group II-VI semiconductor material may include, for example, zinc telluride (ZnTe) or cadmium sulfide (CdS). The substrate 10 may be a bulk wafer or an epitaxial layer. The base insulating layer 20 may include, for example, an oxide. In some embodiments, the base insulating layer 20 may be formed to have a thickness of tens of nm to hundreds of nm. For example, the base insulating layer 20 may be formed to have a thickness of about 100 nm.

Figure 1B:
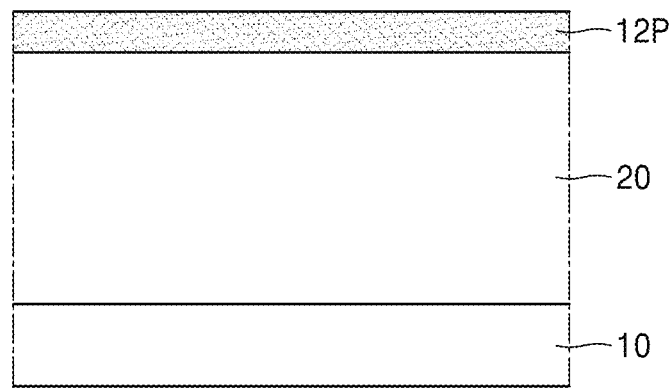

Referring to FIG. 1B, a preliminary seed oxide semiconductor layer 12P is formed on the base insulating layer 20. The preliminary seed oxide semiconductor layer 12P may be formed by, for example, a deposition process. In some embodiments, the preliminary seed oxide semiconductor layer 12P may be formed to have a thickness of several nm to tens of nm. For example, the preliminary seed oxide semiconductor layer 12P may be formed to have a thickness of about 10 nm. The preliminary seed oxide semiconductor layer 12P may include a binary or ternary oxide semiconductor material including a first metal element, or a ternary oxide semiconductor material including the first metal element and a second metal element which are different from each other. The binary or ternary oxide semiconductor material may be one of, for example, a zinc oxide (ZnO or $Zn_xO$), a gallium oxide (GaO or $Ga_xO$), a tin oxide (TiO or $Ti_xO$), a zinc oxynitride (ZnON or $Zn_xO_yN$), an indium zinc oxide (IZO or $In_xZn_yO$), a gallium zinc oxide (GZO or $Ga_xZn_yO$), a tin zinc oxide (TZO or $Sn_xZn_yO$), and a tin gallium oxide (TGO or $Sn_xGa_yO$) but is not limited thereto.

In some embodiments, the preliminary seed oxide semiconductor layer 12P may include an amorphous oxide semiconductor material. For example, the preliminary seed oxide semiconductor layer 12P may include an amorphous GZO.

In some other embodiments, the preliminary seed oxide semiconductor layer 12P may include a crystalline oxide semiconductor material. For example, the preliminary seed oxide semiconductor layer 12P may include at least one of a polycrystalline GZO and a spinel GZO.

Figure 1C:
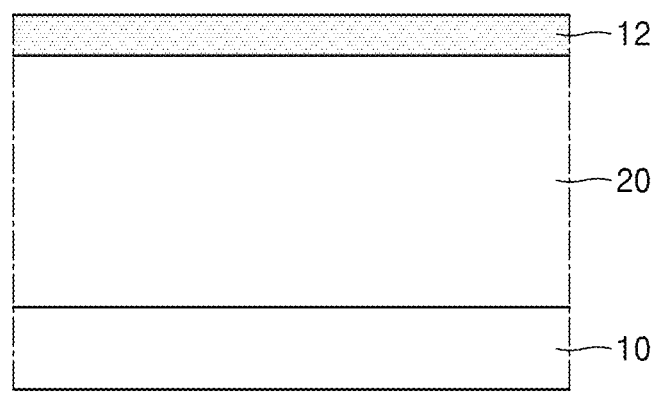

Referring to FIGS. 1B and 1C, a seed oxide semiconductor layer 12 is formed by performing an annealing process on the preliminary seed oxide semiconductor layer 12P. In some embodiments, the annealing process may be performed at a temperature of about 600° C. or less. For example, the annealing process may be performed at a temperature of about 300° C. to about 600° C. By performing the annealing process, the preliminary seed oxide semiconductor layer 12P may be crystallized to become the seed oxide semiconductor layer 12 having crystallinity. For example, the seed oxide semiconductor layer 12 may include at least one of a single crystalline GZO, a polycrystalline GZO, and a spinel GZO.

In some other embodiments, when the preliminary seed oxide semiconductor layer 12P includes a crystalline oxide semiconductor material, the annealing process may be omitted.

Figure 1D:
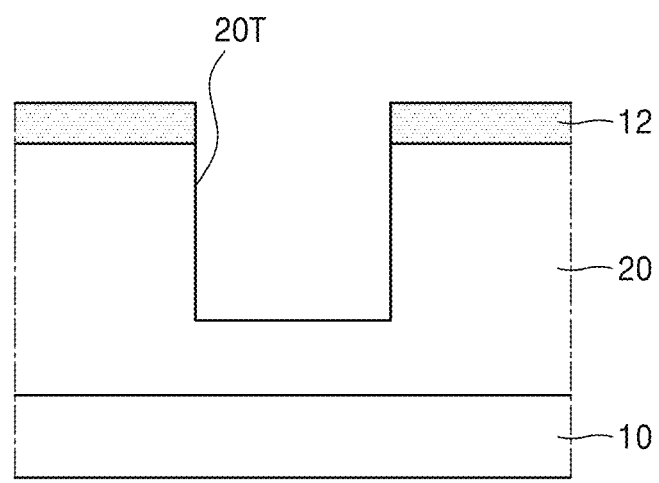

Referring to FIG. 1D, a trench 20T may be formed by removing a part of the seed oxide semiconductor layer 12 and a part of the base insulating layer 20. The trench 20T may extend from an upper surface of the seed oxide semiconductor layer 12 to the inside of the base insulating layer 20. For example, the trench 20T may extend to the inside of the base insulating layer 20 by passing through the seed oxide semiconductor layer 12. In some embodiments, not the substrate 10 but a part of the base insulating layer 20 may be exposed through a bottom surface of the trench 20T. In some embodiments, a horizontal width of the trench 20T may be tens of nm to hundreds nm. For example, the horizontal width of the trench 20T may be about 100 nm.

Figure 1E:
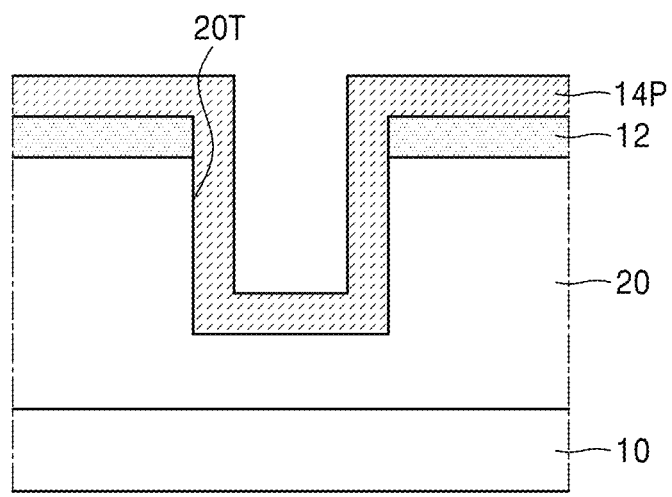

Referring to FIG. 1E, a preliminary oxide semiconductor layer 14P covering the upper surface of the seed oxide semiconductor layer 12 and an inner side surface and the bottom surface of the trench 20T is formed. The preliminary oxide semiconductor layer 14P may be formed by, for example, a deposition process. The preliminary oxide semiconductor layer 14P may be formed to conformally cover the upper surface of the seed oxide semiconductor layer 12 and the inner side surface and the bottom surface of the trench 20T. In some embodiments, the preliminary oxide semiconductor layer 14P may be formed to have a thickness of several nm to tens of nm. For example, the preliminary oxide semiconductor layer 14P may be formed to have a thickness of about 10 nm.

The preliminary oxide semiconductor layer 14P may include a quaternary oxide semiconductor material including the first metal element, the second metal element, and a third metal element that is different from the first metal element and the second metal element. The quaternary oxide semiconductor material may be one of, for example, an indium gallium zinc oxide (IGZO or $In_xGa_yZn_zO$), an indium gallium silicon oxide (IGSO or $In_xGa_ySi_zO$), an indium tin zinc oxide (ITZO or $In_xSn_yZn_zO$), an indium tin gallium oxide (ITGO or $In_xSn_yGa_zO$), a zirconium zinc tin oxide (ZZTO or $Zr_xZn_ySn_zO$), a hafnium indium zinc oxide (HIZO or $Hf_xIn_yZn_zO$), a gallium zinc tin oxide (GZTO or $Ga_xZn_ySn_zO$), an aluminum zinc tin oxide (AZTO or $Al_xZn_ySn_zO$), and an ytterbium gallium zinc oxide (YGZO or $Yb_xGa_yZn_zO$) but is not limited thereto.

The preliminary oxide semiconductor layer 14P may include an amorphous oxide semiconductor material. In some embodiments, the preliminary oxide semiconductor layer 14P may include an amorphous IGZO.

Figure 1F:
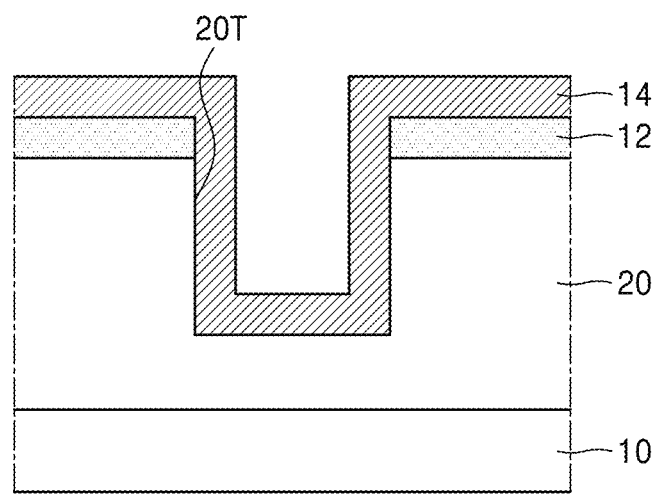

Referring to FIGS. 1E and 1F, a crystalline oxide semiconductor layer 14 is formed by performing an annealing process on the preliminary oxide semiconductor layer 14P. In some embodiments, a temperature at which the annealing process for forming the crystalline oxide semiconductor layer 14 is performed may be higher than the temperature at which the annealing process for forming the seed oxide semiconductor layer 12 is performed. In some embodiments, the annealing process may be performed at a temperature of about 700° C. or less. For example, the annealing process may be performed at a temperature of about 400° C. to about 700° C. By performing the annealing process, the preliminary oxide semiconductor layer 14P may be crystallized to become the crystalline oxide semiconductor layer 14 having crystallinity. In some embodiments, the crystalline oxide semiconductor layer 14 may include at least one of a single crystalline IGZO, a polycrystalline IGZO, a spinel IGZO, and a c-axis aligned crystalline IGZO (CAAC IGZO).

Figure 1G:
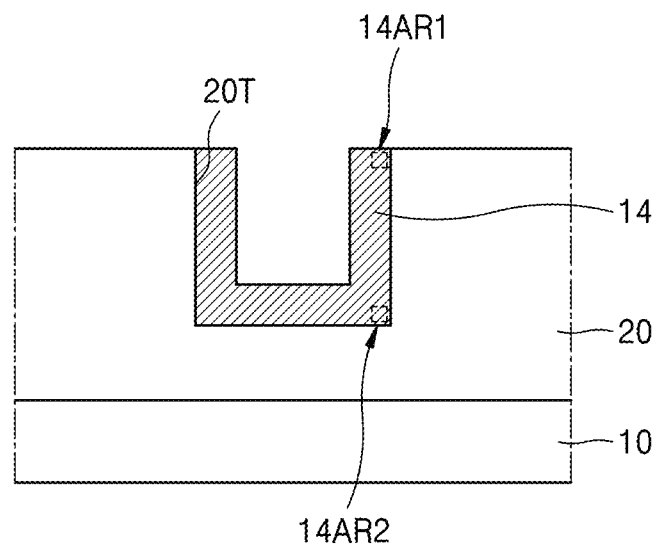

Referring to FIGS. 1F and 1G, a part of the crystalline oxide semiconductor layer 14 and the seed oxide semiconductor layer 12 are removed so that the base insulating layer 20 is exposed. In some embodiments, a mold layer (not shown) filling the trench 20T may be formed before removing the part of the crystalline oxide semiconductor layer 14 and the seed oxide semiconductor layer 12, and then a chemical mechanical polishing (CMP) process may be performed until the base insulating layer 20 is exposed so that a part of an upper side of the crystalline oxide semiconductor layer 14 and the seed oxide semiconductor layer 12 are removed. In some embodiments, after removing the part of the crystalline oxide semiconductor layer 14 and the seed oxide semiconductor layer 12, the mold layer may be removed. In some other embodiments, before removing the part of the crystalline oxide semiconductor layer 14 and the seed oxide semiconductor layer 12, another component located in the trench 20T may be formed.

The method of forming an oxide semiconductor layer included in a semiconductor device, according to example embodiments of the inventive concepts, forms the crystalline oxide semiconductor layer 14 on the seed oxide semiconductor layer 12, and thus, the crystalline oxide semiconductor layer 14 may have a high degree of crystallinity even when the crystalline oxide semiconductor layer 14 is formed at a relatively low temperature. Particularly, the seed oxide semiconductor layer 12 functions as a seed layer in a process of forming the crystalline oxide semiconductor layer 14 so that the crystalline oxide semiconductor layer 14 has a high degree of crystallinity even at a relatively low temperature. Therefore, the performance and the reliability of a semiconductor device including the crystalline oxide semiconductor layer 14 may be improved.

Figure 2:
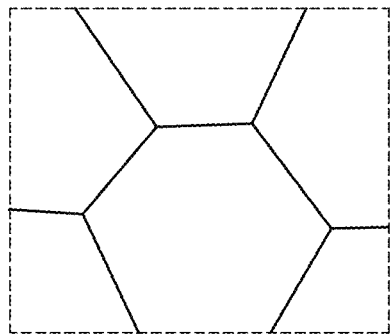
FIG. 2 is a cross-sectional view showing a crystalline oxide semiconductor layer included in a semiconductor device, according to example embodiments of the inventive concepts.
Figure 2:
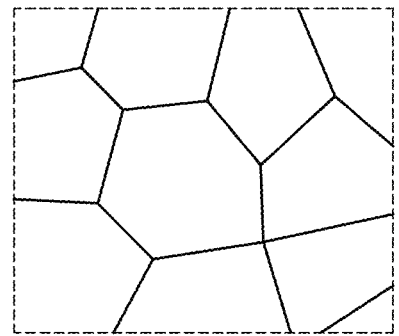

FIG. 2 is a cross-sectional view showing a crystalline oxide semiconductor layer included in a semiconductor device, according to example embodiments of the inventive concepts.

Referring to FIGS. 1g and 2, a first part 14AR1 and a second part 14AR2 of the crystalline oxide semiconductor layer 14 may have different crystallinities. The first part 14AR1 may be an upper part of the crystalline oxide semiconductor layer 14, and the second part 14AR2 may be a lower part of the crystalline oxide semiconductor layer 14. In some embodiments, in the crystalline oxide semiconductor layer 14, the first part 14AR1 may have a higher degree of crystallinity than the second part 14AR2. For example, in the crystalline oxide semiconductor layer 14, a grain size of the first part 14AR1 may be greater than a grain size of the second part 14AR2.

As shown in FIGS. 1F and 1G, because the first part 14AR1 of the crystalline oxide semiconductor layer 14 is adjacent to the seed oxide semiconductor layer 12, the first part 14AR1 may have a relatively high degree of crystallinity, thereby having a relatively large grain size, and because the second part 14AR2 is relatively far from the seed oxide semiconductor layer 12, the second part 14AR2 may have a relatively low degree of crystallinity, thereby having a relatively small grain size.

Figure 3:
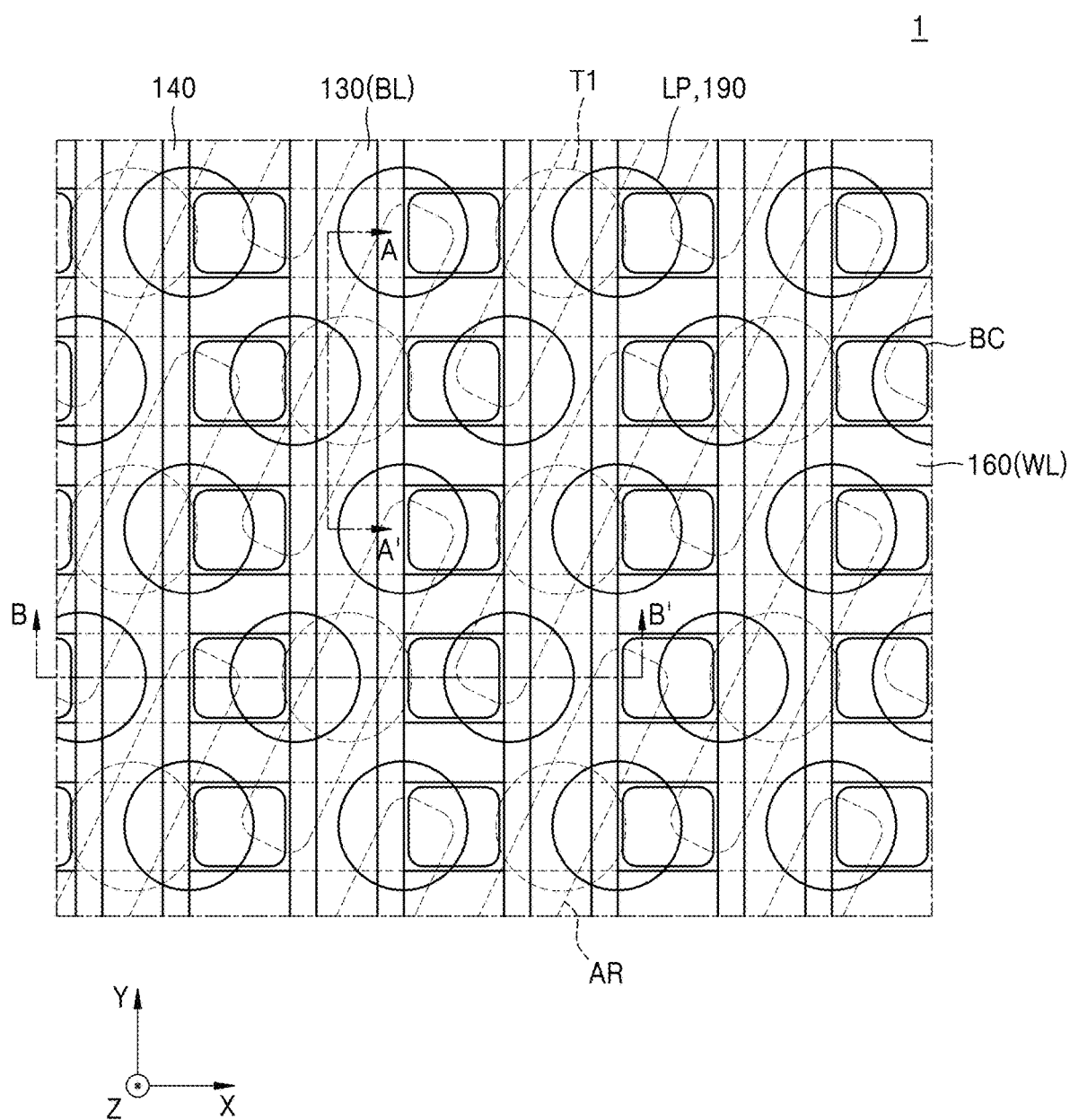
FIG. 3 is a layout diagram showing a semiconductor device according to example embodiments of the inventive concepts.
Figure 4:
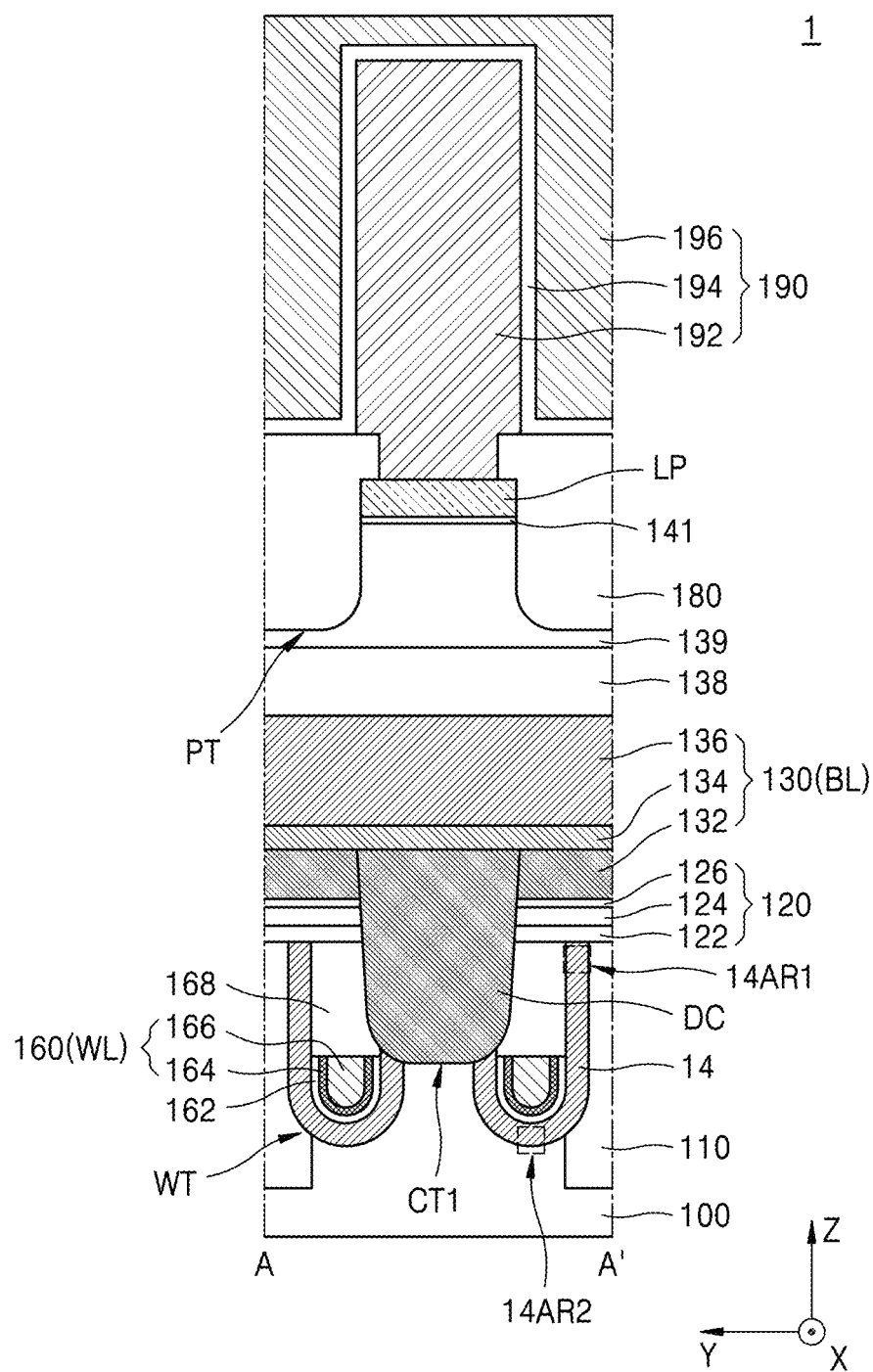
FIG. 4 is a cross-sectional view taken along line A-A' of FIG. 3.
Figure 5:
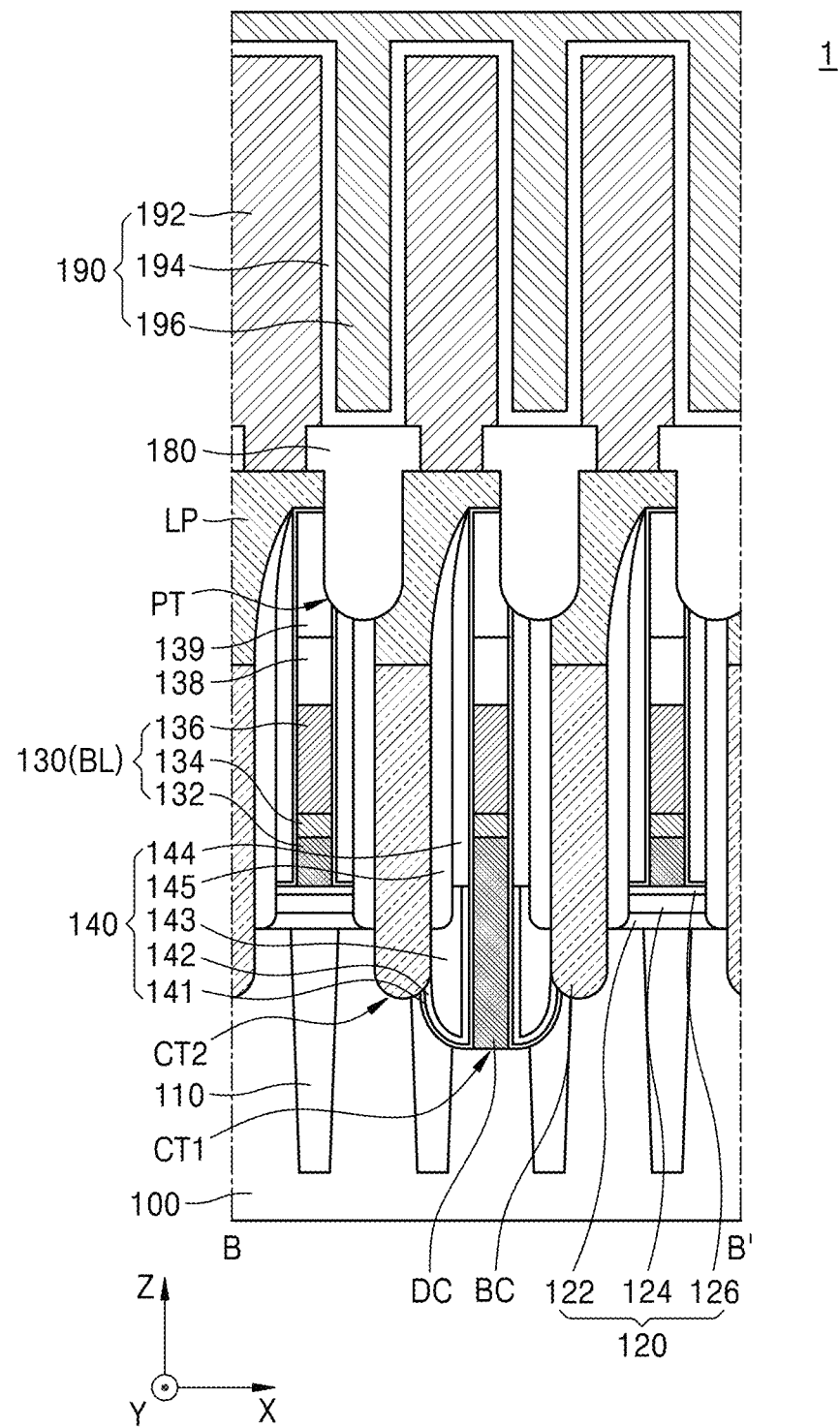
FIG. 5 is a cross-sectional view taken along line B-B' of FIG. 3.

FIG. 3 is a layout diagram showing a semiconductor device 1 according to example embodiments of the inventive concepts, FIG. 4 is a cross-sectional view taken along line A-A' of FIG. 3, and FIG. 5 is a cross-sectional view taken along line B-B' of FIG. 3. For convenience of description, A description made with reference to FIGS. 1A to 2 is briefly repeated or omitted.

Referring to FIGS. 3 to 5, the semiconductor device 1 according to example embodiments of the inventive concepts may include a substrate 100, a device isolation layer 110, a cover insulating layer 120, a conductive line 130 (BL), a direct contact DC, a spacer structure 140, the crystalline oxide semiconductor layer 14, a gate electrode 160 (WL), a gate dielectric layer 162, a contact structure BC and LP, and a capacitor structure 190.

The substrate 100 may include a semiconductor material such as a group IV semiconductor material, a group III-V semiconductor material, or a group II-VI semiconductor material. The group IV semiconductor material may include, for example, Si, Ge, or Si—Ge. The group III-V semiconductor material may include, for example, GaAs, InP, GaP, InAs, InSb, or InGaAs. The group II-VI semiconductor material may include, for example, ZnTe or CdS. The substrate 100 may be a bulk wafer or an epitaxial layer. The substrate 100 may have a structure in which a base substrate and an epitaxial layer are stacked, but is not limited thereto.

The substrate 100 may include an active region AR. The active region AR may have a shape of a plurality of bars extending in directions parallel to each other. In addition, a plurality of active regions AR may be arranged so that the center of one of the plurality of active regions AR is adjacent to an end of another active region AR. In some example embodiments, the active region AR may be formed in a diagonal bar shape. For example, as shown in FIG. 3, the active region AR may have a bar shape extending in a third horizontal direction that is different from a first horizontal direction (X direction) and a second horizontal direction (Y direction) on a plane on which the first horizontal direction (X direction) and the second horizontal direction (Y direction) intersecting with the first horizontal direction (X direction) extend. An acute angle formed by the first horizontal direction (X direction) and the third horizontal direction may be, for example, 60° but is not limited thereto.

The active region AR may be doped with impurities to function as a source/drain region. In some example embodiments, a first part (e.g., a center part) of the active region AR may be electrically connected to the conductive line 130 via the direct contact DC, and a second part (e.g., both end parts) of the active region AR may be electrically connected to the capacitor structure 190 via the contact structure BC and LP.

The device isolation layer 110 may define the plurality of active regions AR. Although FIG. 5 shows that a side surface of the device isolation layer 110 is inclined, the side surface of the device isolation layer 110 is not limited thereto. The device isolation layer 110 may include at least one of a silicon oxide, a silicon nitride, and a silicon oxynitride but is not limited thereto. The device isolation layer 110 may include a single layer including one type of insulating material or a multi-layer including a combination of several types of insulating materials. For example, the device isolation layer 110 may include a single layer including one type of insulating layer, a dual layer including two types of insulating layers, or a multi-layer including a combination of at least three types of insulating layers. In some example embodiments, the device isolation layer 110 may include a single layer including a silicon oxide. In some other example embodiments, the device isolation layer 110 may include a triple layer including a first device isolation layer, a second device isolation layer, and a third device isolation layer but is not limited thereto. For example, the first device isolation layer may conformally cover a part of the substrate 100. In some example embodiments, the first device isolation layer may include a silicon oxide. For example, the second device isolation layer may conformally cover the first device isolation layer. In some example embodiments, the second device isolation layer may include a silicon nitride. For example, the third device isolation layer may cover the second device isolation layer. In some example embodiments, the third device isolation layer may include a silicon oxide. For example, the third device isolation layer may include a silicon oxide formed of tonen silazene (TOSZ).

The cover insulating layer 120 may be formed on the substrate 100 and the device isolation layer 110. In some example embodiments, the cover insulating layer 120 may extend along an upper surface of the substrate 100 and an upper surface of the device isolation layer 110 in a region in which the contact structure BC and LP is not formed. The cover insulating layer 120 may include a single layer but is not limited thereto and may include a multi-layer as shown in FIGS. 4 and 5. For example, the cover insulating layer 120 may include a first insulating layer 122, a second insulating layer 124, and a third insulating layer 126 sequentially stacked on the substrate 100. The first insulating layer 122 may include, for example, a silicon oxide. The second insulating layer 124 may include a material having an etching selectivity that is different from that of the first insulating layer 122. For example, the second insulating layer 124 may include a silicon nitride. The third insulating layer 126 may include a material having a dielectric constant that is less than that of the second insulating layer 124. For example, the third insulating layer 126 may include a silicon oxide.

The conductive line 130 may be formed on the substrate 100, the device isolation layer 110, and the cover insulating layer 120. The conductive line 130 may extend long in the second horizontal direction (Y direction) by crossing the active region AR and the gate electrode 160. For example, the conductive line 130 may diagonally cross the active region AR and vertically cross the gate electrode 160. A plurality of conductive lines 130 may be separated from each other at equal intervals in the first horizontal direction (X direction). Each conductive line 130 may be connected to the active region AR to function as a bit line BL of the semiconductor device 1.

In some example embodiments, the conductive line 130 may include a first sub-conductive pattern 132, a second sub-conductive pattern 134, and a third sub-conductive pattern 136 sequentially stacked above the substrate 100. Each of the first sub-conductive pattern 132, the second sub-conductive pattern 134, and the third sub-conductive pattern 136 may include at least one of, for example, polysilicon, titanium nitride (TiN), titanium silicon nitride (TiSiN), tungsten (W), tungsten silicide, and a combination thereof but is not limited thereto. For example, the first sub-conductive pattern 132 may include polysilicon, the second sub-conductive pattern 134 may include TiSiN, and the third sub-conductive pattern 136 may include W.

In some example embodiments, a first bit line capping pattern 138 and a second bit line capping pattern 139 may be sequentially formed on the conductive line 130. The first bit line capping pattern 138 and the second bit line capping pattern 139 may extend along an upper surface of the conductive line 130. Each of the first bit line capping pattern 138 and the second bit line capping pattern 139 may include a silicon nitride but is not limited thereto.

The direct contact DC may be formed on the substrate 100 and the device isolation layer 110. The direct contact DC may connect the active region AR of the substrate 100 to the conductive line 130 by passing through the cover insulating layer 120. For example, the substrate 100 may have a first contact trench CT1. The first contact trench CT1 may expose the first part (e.g., the center part) of the active region AR by passing through the cover insulating layer 120. The direct contact DC may be formed inside the first contact trench CT1 to connect the first part of the active region AR to the conductive line 130.

In some example embodiments, a part of the first contact trench CT1 may overlap a part of the device isolation layer 110 in a vertical direction (Z direction). Therefore, the first contact trench CT1 may expose not only a part of the active region AR but also a part of the device isolation layer 110.

In some example embodiments, a width of the direct contact DC may be less than a width of the first contact trench CT1. For example, the direct contact DC may be in contact with a part of the substrate 100 exposed by the first contact trench CT1. In some example embodiments, a width of the conductive line 130 may be less than the width of the first contact trench CT1. For example, the width of the conductive line 130 may be substantially the same as the width of the direct contact DC.

The direct contact DC may include a conductive material. The conductive line 130 may be electrically connected to the active region AR of the substrate 100 via the direct contact DC. The first part (e.g., the center part) of the active region AR in contact with the direct contact DC may function as a first source/drain region of the semiconductor device 1 including the gate electrode 160.

In some example embodiments, the direct contact DC may include the same material as the first sub-conductive pattern 132. For example, the direct contact DC may include polysilicon. In some other example embodiments, the direct contact DC may include a material that is different from that of the first sub-conductive pattern 132.

The spacer structure 140 may be formed on a side surface of the conductive line 130. The spacer structure 140 may extend along the side surface of the conductive line 130. For example, the spacer structure 140 may extend long in the second horizontal direction (Y direction). In some example embodiments, the spacer structure 140 may include a first spacer 141, a second spacer 142, a third spacer 143, a fourth spacer 144, and a fifth spacer 145.

The first spacer 141 may extend along the side surface of the conductive line 130. For example, the first spacer 141 may extend along side surfaces of the conductive line 130, the first bit line capping pattern 138, and the second bit line capping pattern 139. In an area in which the first contact trench CT1 is formed, the first spacer 141 may extend along the side surface of the conductive line 130, a side surface of the direct contact DC, and the first contact trench CT1. In some example embodiments, the first spacer 141 may be in contact with the conductive line 130 and the direct contact DC. In an area in which the first contact trench CT1 is not formed, the first spacer 141 may extend along the side surface of the conductive line 130 and an upper surface of the cover insulating layer 120.

The second spacer 142 may be formed on the first spacer 141 inside the first contact trench CT1. For example, the second spacer 142 may extend along a profile of the first spacer 141 inside the first contact trench CT1.

The third spacer 143 may be formed in the second spacer 142 inside the first contact trench CT1. The third spacer 143 may fill a region of the first contact trench CT1, which remains by forming the first spacer 141 and the second spacer 142.

The fourth spacer 144 may be formed on the second spacer 142 and the third spacer 143. The fourth spacer 144 may extend along at least a portion of the side surface of the conductive line 130. For example, the fourth spacer 144 may extend along a side surface of the first spacer 141, on which the second spacer 142 is not formed.

The fifth spacer 145 may be formed on the third spacer 143. The fifth spacer 145 may extend along at least a portion of the side surface of the conductive line 130. For example, the fifth spacer 145 may extend along a side surface of the fourth spacer 144. In some example embodiments, the fifth spacer 145 may be formed so that a lower surface of the fifth spacer 145 is lower than a lower surface of the fourth spacer 144. For example, a lower part of the fifth spacer 145 may be buried inside the third spacer 143.

In some example embodiments, each of the first spacer 141, the second spacer 142, the third spacer 143, the fourth spacer 144, and the fifth spacer 145 may include at least one of a silicon oxide, a silicon oxynitride, a silicon nitride, and a combination thereof. For example, the first spacer 141 may include a silicon nitride, the second spacer 142 may include a silicon oxide, the third spacer 143 may include a silicon nitride, the fourth spacer 144 may include a silicon oxide, and the fifth spacer 145 may include a silicon nitride.

In some other example embodiments, the spacer structure 140 may include an air spacer. The air spacer may include air or void. Because the air spacer has a lower dielectric constant than a silicon oxide, a parasitic capacitance of the semiconductor device 1 may be effectively reduced. For example, the fourth spacer 144 may be the air spacer.

The gate electrode 160 may be formed above the substrate 100 and the device isolation layer 110. The gate electrode 160 may extend long in the first horizontal direction (X direction) by crossing the active region AR and the conductive line 130. For example, the gate electrode 160 may diagonally cross the active region AR and vertically cross the conductive line 130. A plurality of gate electrodes 160 may be separated from each other at equal intervals in the second horizontal direction (Y direction). Each gate electrode 160 may be between the direct contact DC and a buried contact BC to function as a word line WL of the semiconductor device 1.

In some example embodiments, the gate electrode 160 may include a fourth sub-conductive pattern 164 and a fifth sub-conductive pattern 166 sequentially stacked on the substrate 100. Each of the fourth sub-conductive pattern 164 and the fifth sub-conductive pattern 166 may include at least one of, for example, a metal, polysilicon, and a combination thereof but is not limited thereto.

The gate dielectric layer 162 may be between the substrate 100 and the gate electrode 160. The gate dielectric layer 162 may include at least one of, for example, a silicon oxide, a silicon oxynitride, a silicon nitride, and a high-k material of which a dielectric constant is greater than that of the silicon oxide, but is not limited thereto.

In some example embodiments, a gate capping pattern 168 may be formed on the gate electrode 160. The gate capping pattern 168 may include a silicon nitride but is not limited thereto.

The crystalline oxide semiconductor layer 14 may be stacked on the substrate 100 and the device isolation layer 110. The gate dielectric layer 162 and the gate electrode 160 may be sequentially stacked on the crystalline oxide semiconductor layer 14. The crystalline oxide semiconductor layer 14 may function as a channel layer of a transistor including the gate electrode 160.

The first part 14AR1 and the second part 14AR2 of the crystalline oxide semiconductor layer 14 may have different crystallinities. The first part 14AR1 may be an upper part of the crystalline oxide semiconductor layer 14, and the second part 14AR2 may be a lower part of the crystalline oxide semiconductor layer 14. In some example embodiments, in the crystalline oxide semiconductor layer 14, the first part 14AR1 may have a higher degree of crystallinity than the second part 14AR2 as shown in FIG. 2. For example, in the crystalline oxide semiconductor layer 14, a grain size of the first part 14AR1 may be greater than a grain size of the second part 14AR2 as shown in FIG. 2.

The semiconductor device 1 according to some example embodiments may be a semiconductor memory device including a buried channel array transistor (BCAT). The BCAT may have a structure in which a gate electrode (e.g., the gate electrode 160) is buried inside the substrate 100. For example, the substrate 100 may include a gate trench WT extending in the first horizontal direction (X direction). In some example embodiments, the gate trench WT may be formed inside the substrate 100 and the device isolation layer 110. The crystalline oxide semiconductor layer 14 may conformally extend along a profile of the gate trench WT. The gate dielectric layer 162 and the gate electrode 160 may fill a part of the gate trench WT on the crystalline oxide semiconductor layer 14. The gate capping pattern 168 may fill the other part of the gate trench WT on the crystalline oxide semiconductor layer 14. In this case, the gate electrode 160 may be formed so that an upper surface of the gate electrode 160 is lower than the upper surface of the substrate 100.

Although FIG. 4 shows that an uppermost surface of the crystalline oxide semiconductor layer 14 is coplanar with the upper surface of the substrate 100, but this is illustrative, and the present example embodiment is not limited thereto.

The contact structure BC and LP may be formed on the substrate 100 and the device isolation layer 110. The contact structure BC and LP may connect the active region AR of the substrate 100 to the capacitor structure 190 by passing through the cover insulating layer 120. In some example embodiments, the contact structure BC and LP may include the buried contact BC and a landing pad LP.

The buried contact BC may electrically connect the active region AR of the substrate 100 to the landing pad LP by passing through the cover insulating layer 120. For example, the substrate 100 may include a second contact trench CT2. The second contact trench CT2 may expose the second part (e.g., both end parts) of the active region AR by passing through the cover insulating layer 120. The buried contact BC may be formed inside the second contact trench CT2 to electrically connect the second part of the active region AR to the landing pad LP.

In some example embodiments, a part of the second contact trench CT2 may overlap a part of the device isolation layer 110 in the vertical direction (Z direction). For example, the second contact trench CT2 may expose not only a part of the active region AR but also a part of the device isolation layer 110.

The buried contact BC may be formed on a side surface of the spacer structure 140. The buried contact BC may be separated from the conductive line 130 with the spacer structure 140 therebetween. In some example embodiments, the buried contact BC may be formed so that an upper surface of the buried contact BC is lower than an upper surface of the second bit line capping pattern 139.

The buried contact BC may form a plurality of isolated regions separated from each other. For example, as shown in FIG. 3, a plurality of buried contacts BC may be between the plurality of conductive lines 130 and the plurality of gate electrodes 160. In some example embodiments, the plurality of buried contacts BC may be arranged in a matrix form.

The buried contact BC may include a conductive material. Therefore, the buried contact BC may be electrically connected to the active region AR of the substrate 100. The second part (e.g., the both end parts) of the active region AR in contact with the buried contact BC may function as a second source/drain region of the semiconductor device 1 including the gate electrode 160. The buried contact BC may include, for example, polysilicon but is not limited thereto.

The landing pad LP may be formed on the buried contact BC. The landing pad LP may be disposed so that at least a part of the landing pad LP overlaps the buried contact BC in the vertical direction (Z direction). The landing pad LP may be in contact with the upper surface of the buried contact BC to electrically connect the active region AR to the capacitor structure 190.

In some example embodiments, the landing pad LP may be disposed so that the landing pad LP overlaps a part of the buried contact BC and a part of the conductive line 130. For example, the landing pad LP may overlap the part of the buried contact BC and the part of the second bit line capping pattern 139 in the vertical direction (Z direction). In some example embodiments, the landing pad LP may be formed so that an upper surface of the landing pad LP is higher than the upper surface of the second bit line capping pattern 139. For example, the landing pad LP may cover a part of the upper surface of the second bit line capping pattern 139.

The landing pad LP may form a plurality of isolated regions separated from each other. For example, as shown in FIG. 4, a pad trench PT defining a plurality of landing pads LP may be formed. In some example embodiments, a part of the pad trench PT may expose a part of the second bit line capping pattern 139. For example, the pad trench PT may be formed so that a lower surface of the pad trench PT is lower than the upper surface of the second bit line capping pattern 139. The plurality of landing pads LP may be separated from each other with the second bit line capping pattern 139 and the pad trench PT therebetween. In some example embodiments, the plurality of landing pads LP may be arranged in a honeycomb shape.

The landing pad LP may include a conductive material. Accordingly, the landing pad LP may be electrically connected to the buried contact BC. For example, the landing pad LP may include W but is not limited thereto.

In some example embodiments, an upper insulating layer 180 filling the pad trench PT may be formed. The upper insulating layer 180 may be formed on the landing pad LP and the second bit line capping pattern 139. The upper insulating layer 180 may define the landing pad LP forming the plurality of isolated regions.

The upper insulating layer 180 may include an insulating material. Therefore, the plurality of landing pads LP may be electrically isolated from each other. The upper insulating layer 180 may include at least one of, for example, a silicon oxide, a silicon nitride, a silicon oxynitride, and a high-k material of which a dielectric constant is less than that of the silicon oxide, but is not limited thereto.

The capacitor structure 190 may be disposed on the upper insulating layer 180 and the contact structure BC and LP. The capacitor structure 190 may be in contact with an upper surface of the contact structure BC and LP. For example, the upper insulating layer 180 may be patterned to expose at least a part of the upper surface of the landing pad LP, and the capacitor structure 190 may be in contact with the part of the upper surface of the landing pad LP, which is exposed through the upper insulating layer 180. The capacitor structure 190 may be electrically connected to the second part (e.g., the both end parts) of the active region AR via the contact structure BC and LP. The capacitor structure 190 may store data by being controlled by the conductive line 130 and the gate electrode 160.

The capacitor structure 190 may include a lower electrode 192, a capacitor dielectric layer 194, and an upper electrode 196. The capacitor structure 190 may store charges in the capacitor dielectric layer 194 by using a potential difference occurring between the lower electrode 192 and the upper electrode 196.

The lower electrode 192 may be in contact with the contact structure BC and LP. For example, the lower electrode 192 may be in contact with the part of the upper surface of the landing pad LP, which is exposed through the upper insulating layer 180. Although FIGS. 4 and 5 show that the lower electrode 192 has a pillar shape extending in the vertical direction (Z direction) from the upper surface of the landing pad LP, this is illustrative. In another example embodiment, the lower electrode 192 may have a cylindrical shape extending in the vertical direction (Z direction) from the upper surface of the landing pad LP. In some example embodiments, a plurality of lower electrodes 192 may be arranged in a honeycomb shape.

The capacitor dielectric layer 194 may be formed on the plurality of lower electrodes 192. In some example embodiments, the capacitor dielectric layer 194 may conformally extend along a profile of side surfaces and upper surfaces of the plurality of lower electrodes 192 and an upper surface of the upper insulating layer 180.

The upper electrode 196 may be formed on the capacitor dielectric layer 194. Although FIGS. 4 and 5 show that the upper electrode 196 fills regions between adjacent lower electrodes 192, this is only illustrative. As another example, the upper electrode 196 may conformally extend along a profile of the capacitor dielectric layer 194.

In the semiconductor device 1 according to example embodiments of the inventive concepts, the crystalline oxide semiconductor layer 14 functioning as a channel layer of a transistor may have a high degree of crystallinity and be formed at a relatively low temperature. Therefore, the performance and the reliability of the semiconductor device 1 may be improved.

FIGS. 6A to 6E are cross-sectional views showing a method of manufacturing a semiconductor device, according to example embodiments of the inventive concepts. Particularly, FIGS. 6A to 6E are cross-sectional views taken along line A-A' of FIG. 3.

Figure 6A:
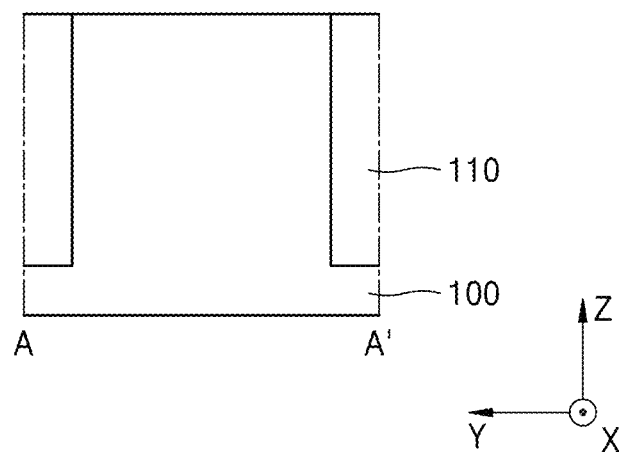
FIGS. 6A to 6E are cross-sectional views showing a method of manufacturing a semiconductor device, according to example embodiments of the inventive concepts.

Referring to FIG. 6A, a part of the substrate 100 is removed, and the device isolation layer 110 filling the removed part of the substrate 100 is formed. In some example embodiments, a part of the substrate 100 may be removed, a preliminary device isolation layer filling the removed part of the substrate 100 and covering the upper surface of the substrate 100 may be formed, and then, the device isolation layer 110 may be formed by removing a part of an upper side of the preliminary device isolation layer so as to expose the upper surface of the substrate 100.

Figure 6B:
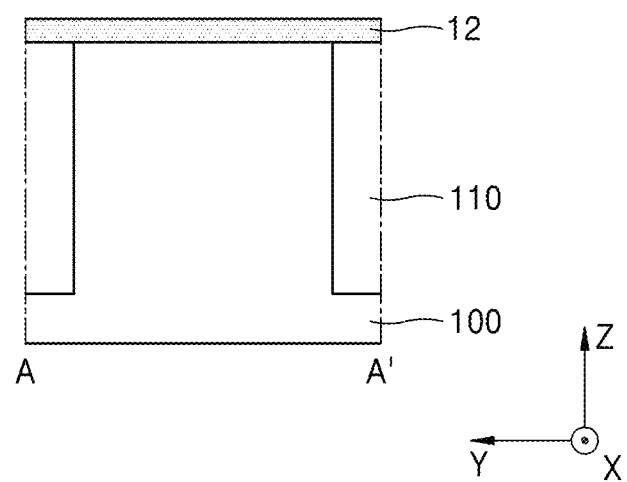

Referring to FIG. 6B, the seed oxide semiconductor layer 12 covering the substrate 100 and the device isolation layer 110 is formed. In some example embodiments, by referring to the description made with reference to FIGS. 1B and 1C, the seed oxide semiconductor layer 12 may be formed by forming the preliminary seed oxide semiconductor layer 12P covering the substrate 100 and the device isolation layer 110 and then performing an annealing process. In some other example embodiments, when the seed oxide semiconductor layer 12 is formed to include a crystalline oxide semiconductor material, the annealing process may be omitted.

Figure 6C:
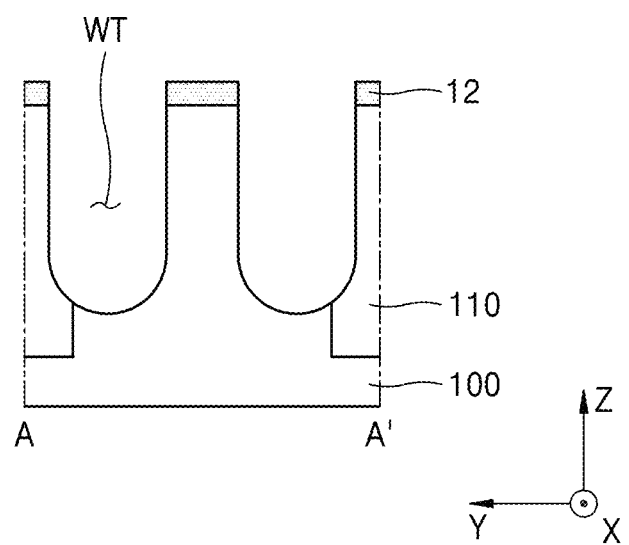

Referring to FIG. 6C, the gate trench WT may be formed by removing a part of the seed oxide semiconductor layer 12, a part of the device isolation layer 110, and a part of the substrate 100. A bottom surface of the gate trench WT may be at a higher vertical level than a lower surface of the device isolation layer 110. The gate trench WT may be formed to extend in the first horizontal direction (X direction).

Figure 6D:
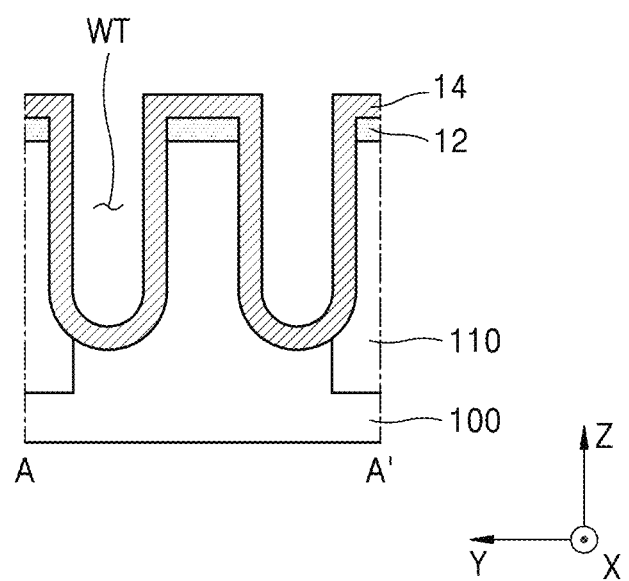

Referring to FIG. 6D, the crystalline oxide semiconductor layer 14 covering the upper surface of the seed oxide semiconductor layer 12 and an inner side surface and the bottom surface of the gate trench WT is formed. In some example embodiments, by referring to the description made with reference to FIGS. 1E and 1F, the crystalline oxide semiconductor layer 14 may be formed by forming a preliminary crystalline oxide semiconductor layer 14P covering the upper surface of the seed oxide semiconductor layer 12 and the inner side surface and the bottom surface of the gate trench WT and then performing an annealing process.

Figure 6E:
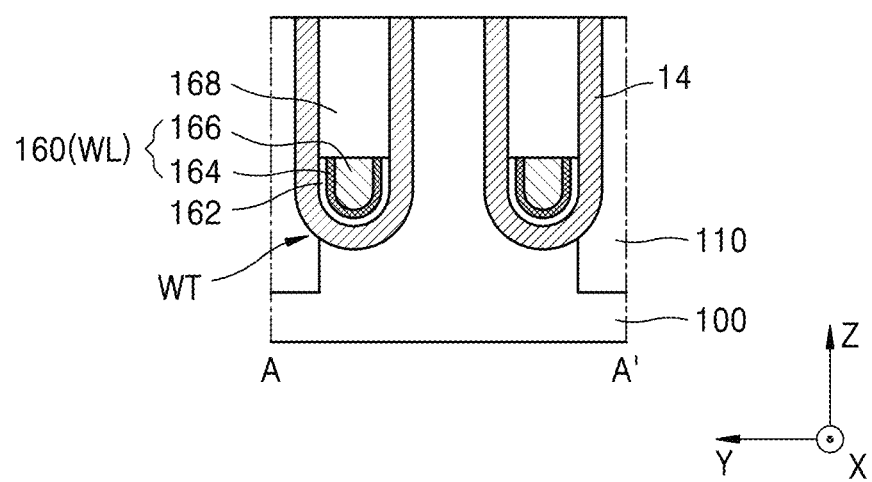

Referring to FIGS. 6D and 6E, in the result of FIG. 6D, the gate dielectric layer 162 and the gate electrode 160 are formed inside the gate trench WT. The gate dielectric layer 162 and the gate electrode 160 may be sequentially stacked on the crystalline oxide semiconductor layer 14. Each of the gate dielectric layer 162 and the gate electrode 160 may conformally extend along a profile of the crystalline oxide semiconductor layer 14.

In some example embodiments, the gate dielectric layer 162 and the gate electrode 160 may fill a part of the gate trench WT on the crystalline oxide semiconductor layer 14. The gate capping pattern 168 may fill the other part of the gate trench WT on the crystalline oxide semiconductor layer 14. Therefore, the gate electrode 160 may be formed so that the upper surface of the gate electrode 160 is lower than the upper surface of the substrate 100.

In a process of forming the gate dielectric layer 162, the gate electrode 160, and the gate capping pattern 168, a part of the crystalline oxide semiconductor layer 14 covering the upper surface of the substrate 100 may be removed.

Thereafter, referring to FIGS. 3 to 5, the semiconductor device 1 may be manufactured by forming the cover insulating layer 120, the conductive line 130 (BL), the direct contact DC, the spacer structure 140, the contact structure BC and LP, and the capacitor structure 190 on the substrate 100 and the device isolation layer 110.

Figure 7:
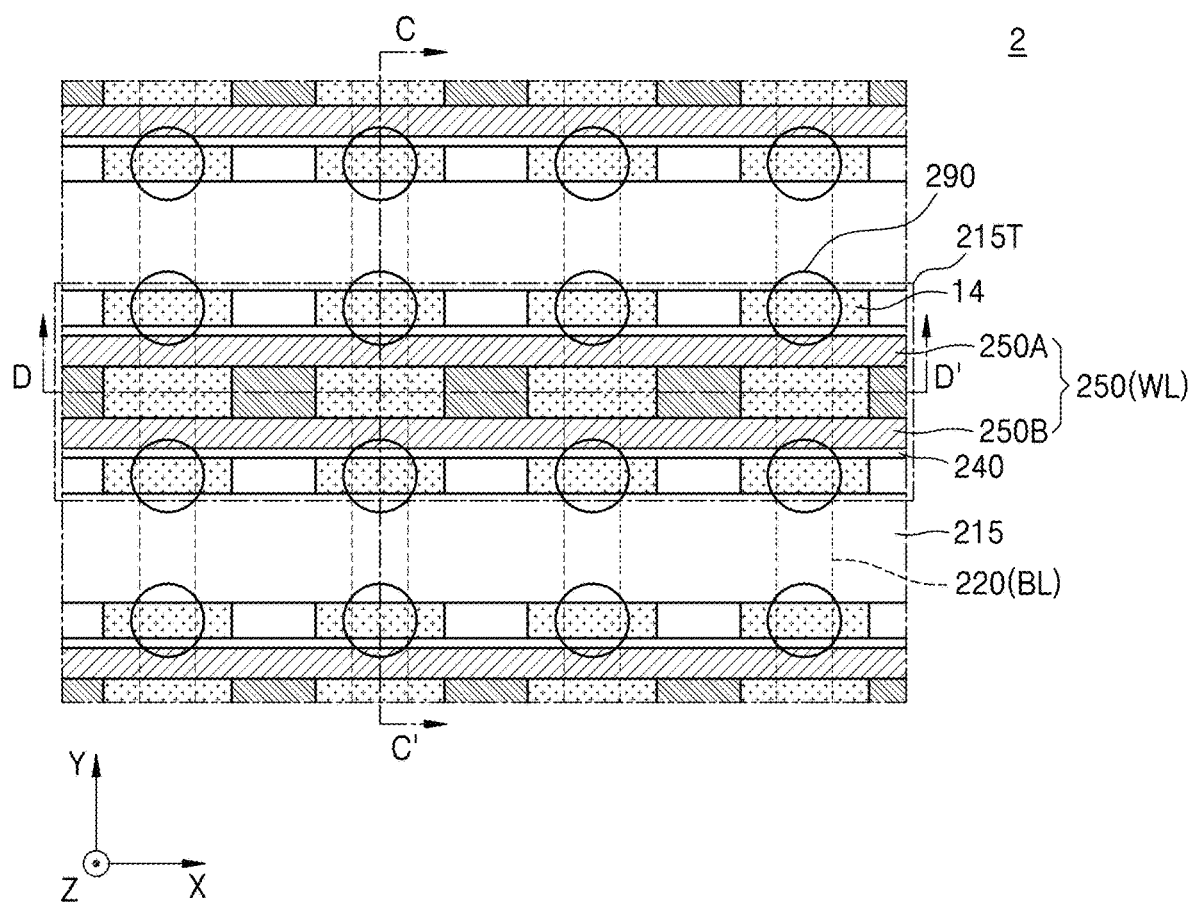
FIG. 7 is a layout diagram showing a semiconductor device according to example embodiments of the inventive concepts.
Figure 8A:
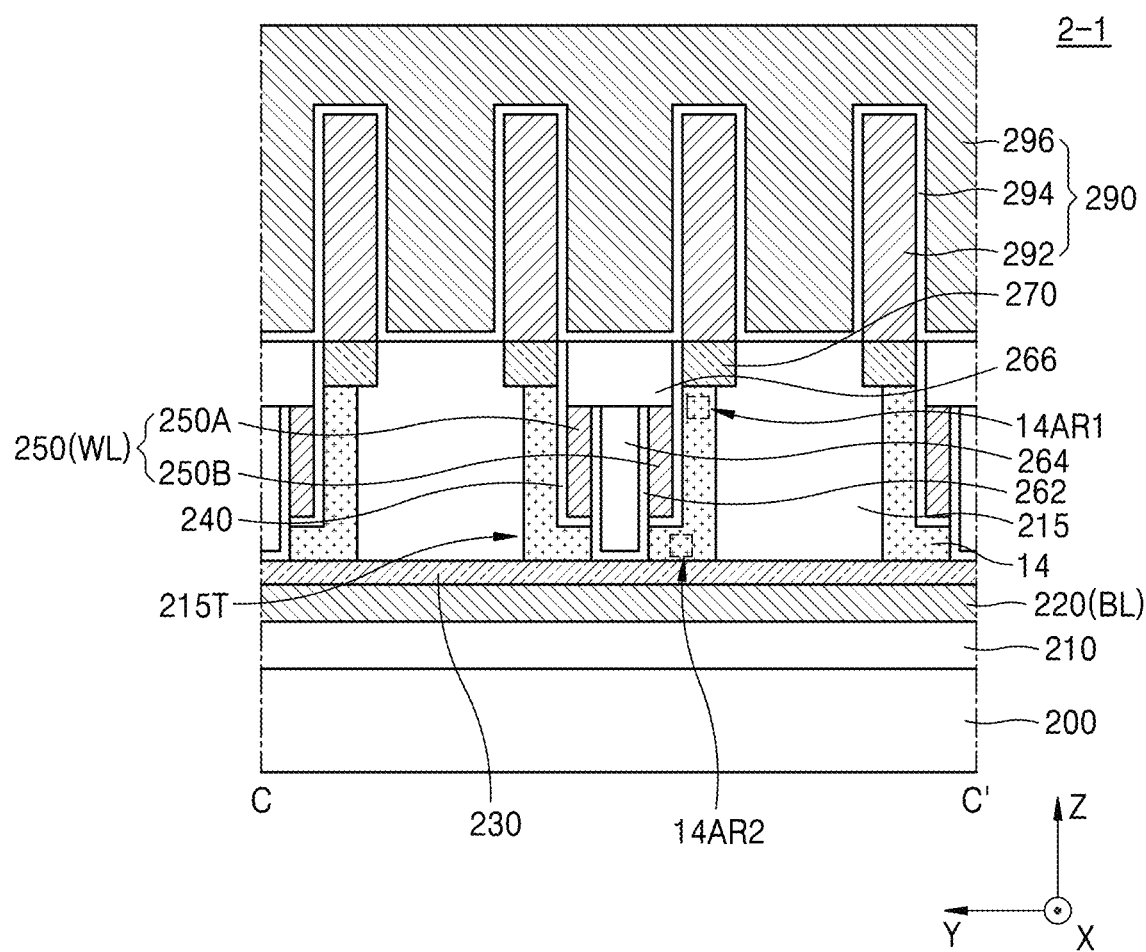
FIGS. 8A and 8B are cross-sectional views taken along line C-C' of FIG. 7, and FIGS. 9a to 9C are cross-sectional views taken along line D-D' of FIG. 7.
Figure 8B:
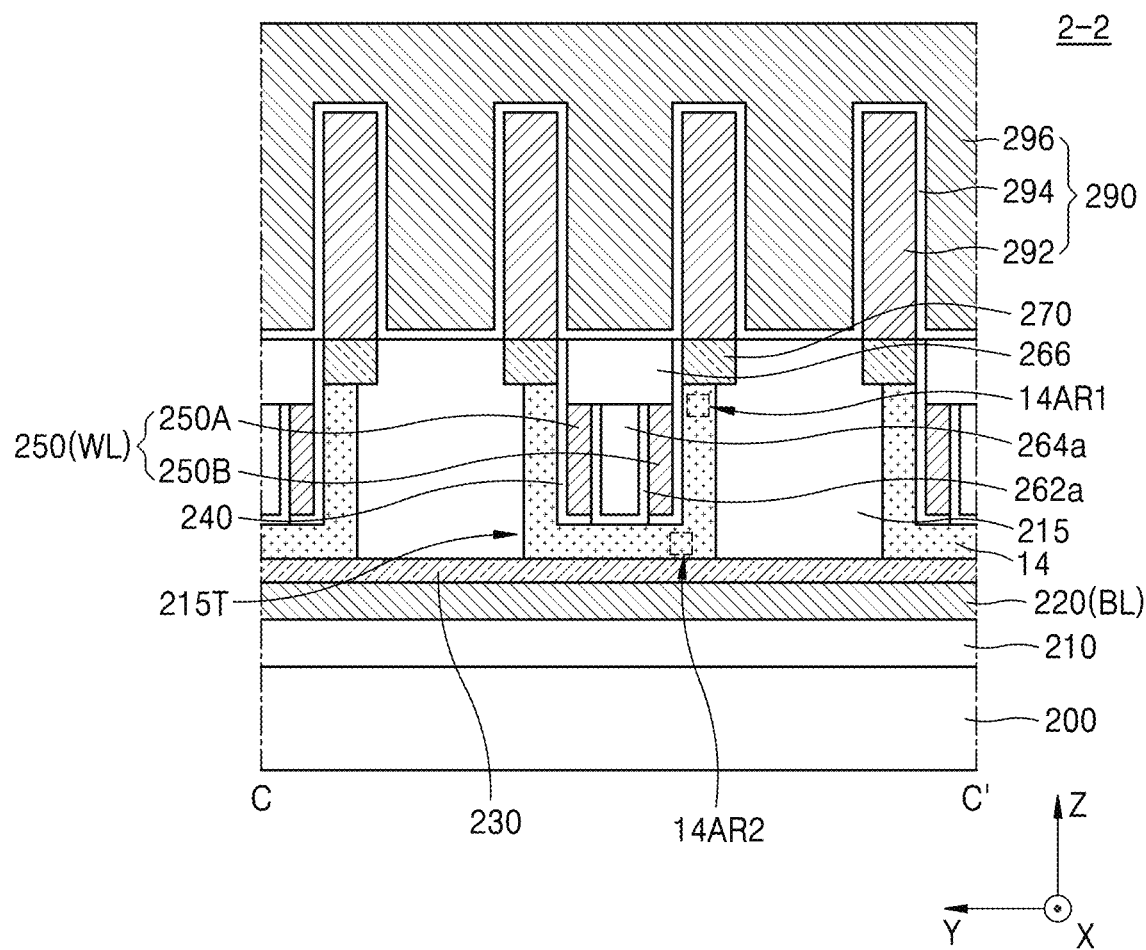

FIG. 7 is a layout diagram showing a semiconductor device 2 according to example embodiments of the inventive concepts, FIGS. 8A and 8B are cross-sectional views taken along line C-C' of FIG. 7, and FIGS. 9a to 9C are cross-sectional views taken along line D-D' of FIG. 7. Particularly, a cross-sectional view taken along C-C' of the semiconductor device 2 shown in FIG. 7 may be a semiconductor device 2-1 shown in FIG. 8A or a semiconductor device 2-2 shown in FIG. 8B, and a cross-sectional view taken along D-D' of the semiconductor device 2 shown in FIG. 7 may be a semiconductor device 2-3 shown in FIG. 9A, a semiconductor device 2-4 shown in FIG. 9B, or a semiconductor device 2-5 shown in FIG. 9C.

Figure 9A:
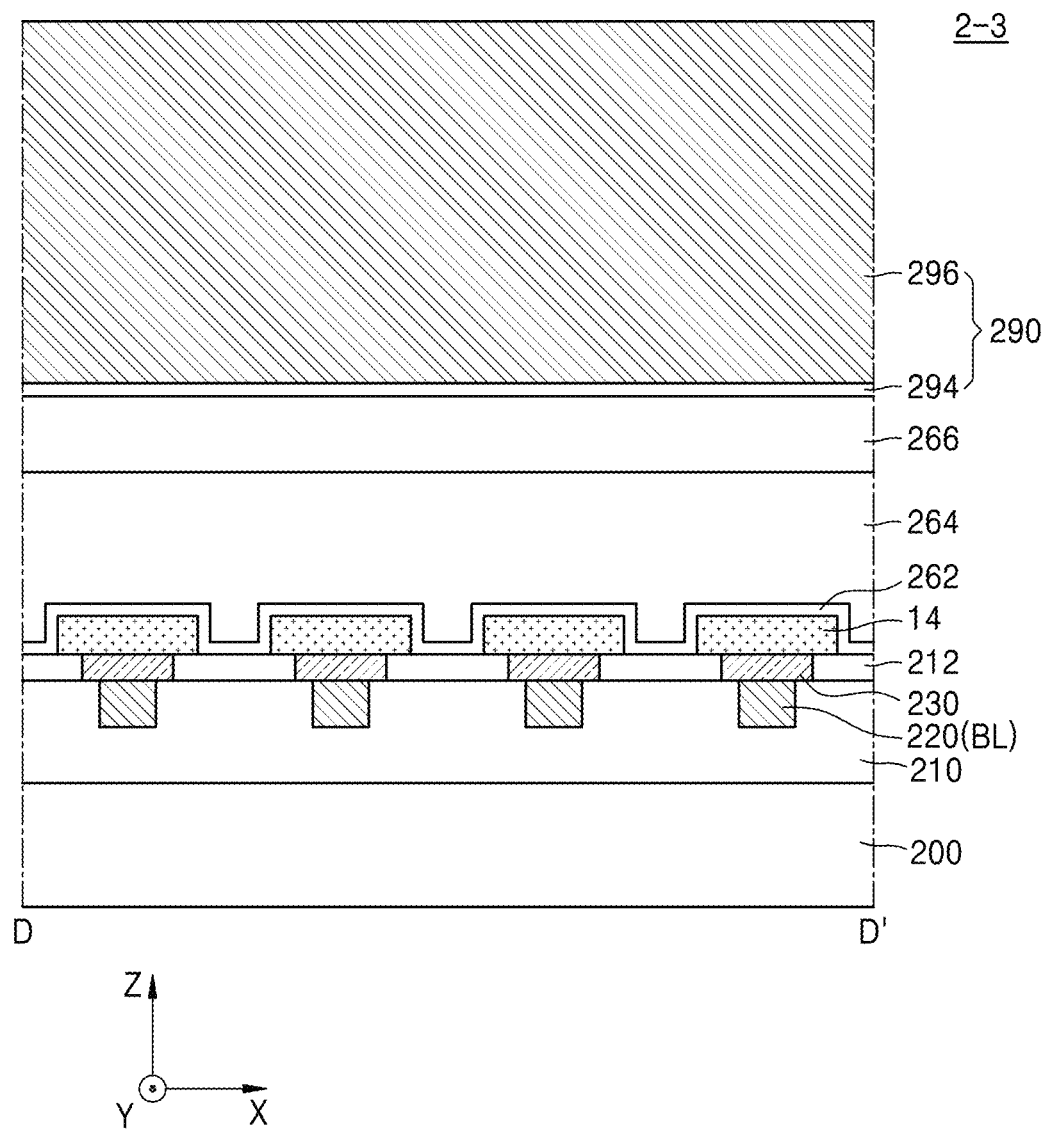
Figure 9B:
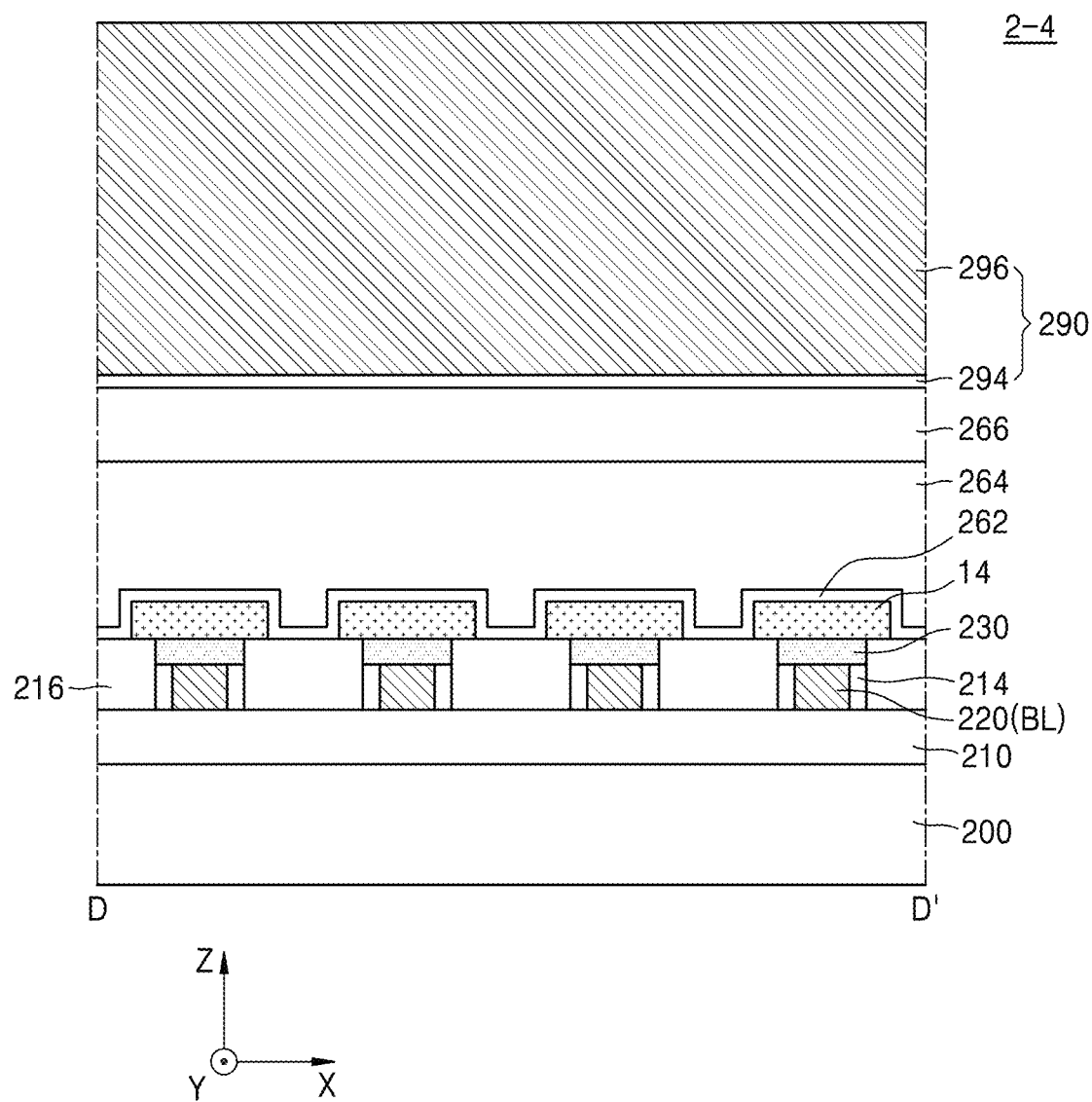
Figure 9C:
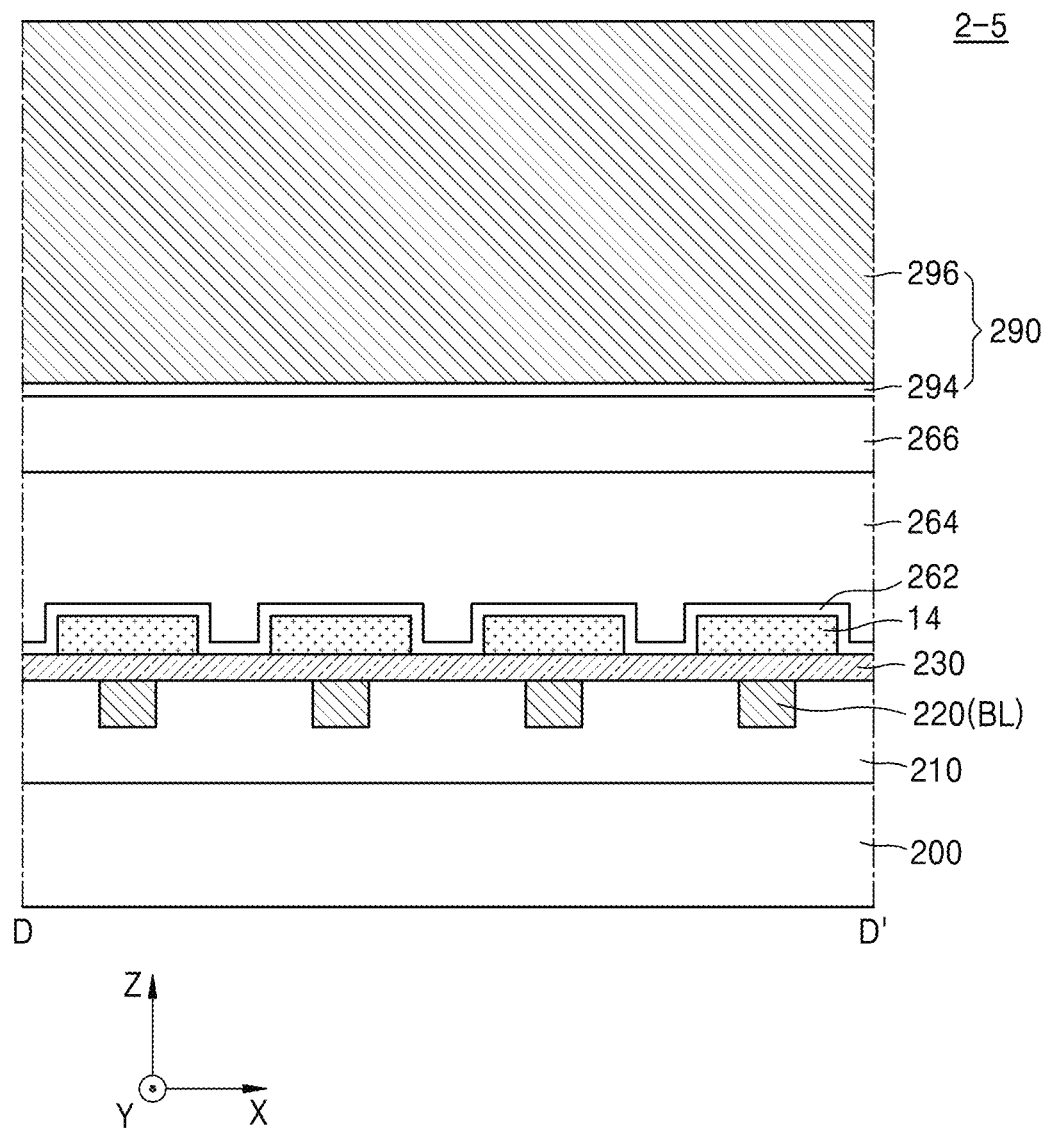

Hereinafter, the semiconductor device 2 shown in FIG. 7 is described together with the semiconductor device 2-1 shown in FIG. 8A and the semiconductor device 2-3 shown in FIG. 9A, and differences from the semiconductor device 2-2 shown in FIG. 8B, the semiconductor device 2-4 shown in FIG. 9B, and the semiconductor device 2-5 shown in FIG. 9C are separately described if necessary.

Referring to FIGS. 7, 8A, and 9A, the semiconductor device 2, 2-1, or 2-3 may include a substrate 200, a conductive line 220 (BL), a lower contact layer 230, an isolation insulating layer 215, the crystalline oxide semiconductor layer 14, a gate dielectric layer 240, a gate electrode 250 (WL), an upper contact layer 270, and a capacitor structure 290.

The substrate 200 is substantially the same as the substrate 100 described with reference to FIGS. 3 to 5, and thus, a detailed description thereof is omitted. The conductive line 220 may be formed above the substrate 200. For example, a lower insulating layer 210 may be formed on the substrate 200. The conductive line 220 may be on the lower insulating layer 210. The conductive line 220 may extend long in the second horizontal direction (Y direction). A plurality of conductive lines 220 may extend in the second horizontal direction (Y direction) and be separated at equal intervals in the first horizontal direction (X direction). The lower insulating layer 210 may be formed to fill a space between conductive lines 220 while covering side surfaces of the conductive lines 220. In some example embodiments, an upper surface of the lower insulating layer 210 may be at the same vertical level as upper surfaces of the plurality of conductive lines 220. The conductive line 220 may function as a bit line BL of the semiconductor device 2.

The conductive line 220 may include doped polysilicon, a metal, a conductive metal nitride, a conductive metal silicide, a conductive metal oxide, or a combination thereof. For example, the conductive line 220 may include doped polysilicon, aluminum (Al), copper (Cu), titanium (Ti), tantalum (Ta), ruthenium (Ru), W, molybdenum (Mo), platinum (Pt), Nickel (Ni), cobalt (Co), titanium nitride (TiN), tantalum nitride (TaN), tungsten nitride (WN), niobium nitride (NbN), titanium aluminide (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrOx), ruthenium oxide (RuOx), or a combination thereof but is not limited thereto. Alternatively, the conductive line 220 may include a two-dimensional (2D) semiconductor material. The 2D semiconductor material may include, for example, graphene, a carbon nanotube, or a combination thereof. The conductive line 220 may include a single layer or a multi-layer of the conductive materials described above.

The lower contact layer 230 may be formed on the conductive line 220. The lower contact layer 230 may connect the conductive line 220 to the crystalline oxide semiconductor layer 14. The lower contact layer 230 may include a conductive material, e.g., at least one of a metal, a conductive metal nitride, a conductive metal carbonitride, a conductive metal carbide, a metal silicide, a doped semiconductor material, a conductive metal oxynitride, a conductive metal oxide, and a 2D material, but is not limited thereto. For example, the lower contact layer 230 may include an indium tin oxide (ITO).

The isolation insulating layer 215 may be formed above the conductive line 220. For example, the isolation insulating layer 215 may be formed on the lower contact layer 230. The isolation insulating layer 215 may include a channel trench 215T extending long in the first horizontal direction (X direction). The channel trench 215T may extend from an upper surface of the isolation insulating layer 215 to a lower surface of the isolation insulating layer 215. For example, the isolation insulating layer 215 may form a plurality of insulating patterns, each extending in the first horizontal direction (X direction), and separated from each other with the channel trench 215T therebetween. The channel trench 215T may expose at least a part of the lower contact layer 230. For example, the channel trench 215T may expose an upper surface of the lower contact layer 230.

The isolation insulating layer 215 may include at least one of, for example, a silicon oxide, a silicon oxynitride, a silicon nitride, and a low-k material of which a dielectric constant is less than that of the silicon oxide, but is not limited thereto.

The crystalline oxide semiconductor layer 14 may be formed on the conductive line 220. The crystalline oxide semiconductor layer 14 may be formed inside the channel trench 215T. For example, the crystalline oxide semiconductor layer 14 may extend along a side surface and a bottom surface of the channel trench 215T. The crystalline oxide semiconductor layer 14 may be electrically connected to the conductive line 220. For example, the crystalline oxide semiconductor layer 14 extending along the bottom surface of the channel trench 215T may be in contact with the upper surface of the lower contact layer 230. The first part 14AR1 and the second part 14AR2 of the crystalline oxide semiconductor layer 14 may have different crystallinities. In some example embodiments, in the crystalline oxide semiconductor layer 14, the first part 14AR1 may have a higher degree of crystallinity than the second part 14AR2 as shown in FIG. 2. The first part 14AR1 may be an upper part of the crystalline oxide semiconductor layer 14, and the second part 14AR2 may be a lower part of the crystalline oxide semiconductor layer 14. For example, in the crystalline oxide semiconductor layer 14, a grain size of the first part 14AR1 may be greater than a grain size of the second part 14AR2 as shown in FIG. 2.

In some example embodiments, the semiconductor device 2 may be a semiconductor memory device including a vertical channel transistor (VCT). The VCT may have a structure in which a channel length of a channel layer, i.e., the crystalline oxide semiconductor layer 14, extends in the vertical direction (Z direction) that is perpendicular to an upper surface of the substrate 200. For example, the crystalline oxide semiconductor layer 14 may include a first source/drain region and a second source/drain region disposed in the vertical direction (Z direction). For example, a lower part of the crystalline oxide semiconductor layer 14 may function as the first source/drain region, and an upper part of the crystalline oxide semiconductor layer 14 may function as the second source/drain region. A region of the crystalline oxide semiconductor layer 14 between the first source/drain region and the second source/drain region may function as a channel region.

In some example embodiments, a plurality of crystalline oxide semiconductor layers 14 separated from each other may be formed above the conductive line 220. The plurality of crystalline oxide semiconductor layers 14 may be arranged in a matrix form by being separated from each other in the first horizontal direction (X direction) and the second horizontal direction (Y direction).

The gate dielectric layer 240 may be formed on the crystalline oxide semiconductor layer 14 inside the channel trench 215T. The gate dielectric layer 240 may be between the crystalline oxide semiconductor layer 14 and the gate electrode 250. For example, the gate dielectric layer 240 may extend along an inner side surface and an upper surface of the crystalline oxide semiconductor layer 14. The gate dielectric layer 240 may include at least one of, for example, a silicon oxide, a silicon oxynitride, a silicon nitride, and a high-k material of which a dielectric constant is greater than that of the silicon oxide, but is not limited thereto.

The gate electrode 250 may be formed on the gate dielectric layer 240 inside the channel trench 215T. The gate electrode 250 may extend long in the first horizontal direction (X direction). The gate electrode 250 may include doped polysilicon, a metal, a conductive metal nitride, a conductive metal silicide, a conductive metal oxide, or a combination thereof. For example, the gate electrode 250 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof but is not limited thereto.

In some example embodiments, the gate electrode 250 may include a first gate electrode 250A and a second gate electrode 250B facing each other inside one channel trench 215T. The first gate electrode 250A and the second gate electrode 250B may be separated from each other in the second horizontal direction (Y direction), each extending long in the first horizontal direction (X direction). In this case, a structure of two transistors for one crystalline oxide semiconductor layer 14 may be implemented. For example, the first gate electrode 250A may function as a first word line of the semiconductor device 2, and the second gate electrode 250B may function as a second word line of the semiconductor device 2.

In some example embodiments, a barrier insulating layer 262 and a gap-fill insulating layer 264 may be formed between the first gate electrode 250A and the second gate electrode 250B. The first gate electrode 250A and the second gate electrode 250B may be separated from each other with the barrier insulating layer 262 and the gap-fill insulating layer 264 therebetween. The gap-fill insulating layer 264 may be formed on the barrier insulating layer 262 and fill a region between the first gate electrode 250A and the second gate electrode 250B.

Each of the barrier insulating layer 262 and the gap-fill insulating layer 264 may include at least one of a silicon oxide, a silicon oxynitride, a silicon nitride, and a combination thereof but is not limited thereto. For example, the barrier insulating layer 262 may include a silicon nitride, and the gap-fill insulating layer 264 may include a silicon oxide.

In some example embodiments, referring to FIGS. 7 and 8A, in the semiconductor device 2 or 2-1, the crystalline oxide semiconductor layer 14 may include a first channel part and a second channel part separated from each other with the barrier insulating layer 262 and the gap-fill insulating layer 264 therebetween and facing each other. The crystalline oxide semiconductor layer 14 may be divided by the barrier insulating layer 262 and the gap-fill insulating layer 264 to form the first channel part and the second channel part. The barrier insulating layer 262 may be in contact with the lower contact layer 230. For example, the barrier insulating layer 262 may be formed so that a lowermost surface of the barrier insulating layer 262 is lower than or equal to a lowermost surface of the crystalline oxide semiconductor layer 14.

The first channel part and the second channel part may be separated from each other in the second horizontal direction (Y direction). For example, the first channel part may extend along one side surface of the channel trench 215T, and the second channel part may extend along the other side surface of the channel trench 215T.

In some example embodiments, a gate capping pattern 266 may be formed on the gate electrode 250. The gate capping pattern 266 may cover, for example, an upper surface of the gate electrode 250, an upper surface of the barrier insulating layer 262, and an upper surface of the gap-fill insulating layer 264. The gate capping pattern 266 may include a silicon nitride but is not limited thereto.

In some example embodiments, referring to FIGS. 7 and 8B, in the semiconductor device 2 or 2-2, a barrier insulating layer 262a and a gap-fill insulating layer 264a may be included instead of the barrier insulating layer 262 and the gap-fill insulating layer 264 shown in FIG. 8A. The barrier insulating layer 262a and the gap-fill insulating layer 264a may divide the gate electrode 250 into the first gate electrode 250A and the second gate electrode 250B facing each other inside one channel trench 215T but not divide the crystalline oxide semiconductor layer 14. The barrier insulating layer 262a may be in contact with the crystalline oxide semiconductor layer 14 but not be in contact with the lower contact layer 230. For example, the barrier insulating layer 262a may be formed so that a lowermost surface of the barrier insulating layer 262a is higher than the lowermost surface of the crystalline oxide semiconductor layer 14.

The barrier insulating layer 262a may extend along an inner side surface of the first gate electrode 250A, an upper surface of the crystalline oxide semiconductor layer 14, and an inner side surface of the second gate electrode 250B, and the gap-fill insulating layer 264a may be formed on the barrier insulating layer 262a and fill a region between the first gate electrode 250A and the second gate electrode 250B.

In some example embodiments, the gate capping pattern 266 may be formed on the gate electrode 250. The gate capping pattern 266 may cover, for example, the upper surface of the gate electrode 250, an upper surface of the barrier insulating layer 262a, and an upper surface of the gap-fill insulating layer 264a. The gate capping pattern 266 may include a silicon nitride but is not limited thereto.

Referring back to FIGS. 7, 8A, and 9A, the upper contact layer 270 may be formed on the crystalline oxide semiconductor layer 14. For example, the upper contact layer 270 may be in contact with the upper surface of the crystalline oxide semiconductor layer 14. The upper contact layer 270 may connect the crystalline oxide semiconductor layer 14 to the capacitor structure 290. The upper contact layer 270 may include a conductive material, e.g., at least one of a metal, a conductive metal nitride, a conductive metal carbonitride, a conductive metal carbide, a metal silicide, a doped semiconductor material, a conductive metal oxynitride, a conductive metal oxide, and a 2D material, but is not limited thereto.

In some example embodiments, two upper contact layers 270 may be formed for each crystalline oxide semiconductor layer 14. For example, the upper surface of the crystalline oxide semiconductor layer 14 adjacent to the first gate electrode 250A may be in contact with one upper contact layer 270, and the upper surface of the crystalline oxide semiconductor layer 14 adjacent to the second gate electrode 250B may be in contact with another upper contact layer 270.

The capacitor structure 290 may be formed on the isolation insulating layer 215 and the upper contact layer 270. The capacitor structure 290 may be in contact with an upper surface of the upper contact layer 270. The capacitor structure 290 may store data by being controlled by the conductive line 220 and the gate electrode 250.

The capacitor structure 290 may include a lower electrode 292, a capacitor dielectric layer 294, and an upper electrode 296. The capacitor structure 290 may store charges in the capacitor dielectric layer 294 by using a potential difference occurring between the lower electrode 292 and the upper electrode 296.

The capacitor structure 290 including the lower electrode 292, the capacitor dielectric layer 294, and the upper electrode 296 is generally the same as the capacitor structure 190 including the lower electrode 192, the capacitor dielectric layer 194, and the upper electrode 196, which has been described with reference to FIGS. 3 to 5, and thus, a description thereof is omitted.

In some example embodiments, referring to FIGS. 7 and 9A, a plurality of lower contact layers 230 arranged in the first horizontal direction (X direction) may be separated from each other with an upper insulating layer 212 therebetween. The upper insulating layer 212 may cover a part of the upper surface of the lower insulating layer 210. In some example embodiments, the plurality of lower contact layers 230 may correspond to the plurality of crystalline oxide semiconductor layers 14 and the plurality of conductive lines 220 arranged in the first horizontal direction (X direction). Each of the plurality of lower contact layers 230 may electrically connect one conductive line 220 to the plurality of crystalline oxide semiconductor layers 14 arranged in the second horizontal direction (Y direction).

In some example embodiments, referring to FIGS. 7 and 9B, a filling oxide layer 216 may be formed on the lower insulating layer 210. The filling oxide layer 216 may include, for example, an oxide. For example, the filling oxide layer 216 may cover a side surface of the conductive line 220. A side insulating layer 214 may be between the conductive line 220 and the filling oxide layer 216. The side insulating layer 214 may cover the side surface of the conductive line 220. The side insulating layer 214 may prevent oxygen atoms of the filling oxide layer 216 from spreading to the conductive line 220. The side insulating layer 214 may include, for example, a silicon nitride but is not limited thereto. At least a part of a lower surface of the crystalline oxide semiconductor layer 14 may be in contact with the filling oxide layer 216.

In some example embodiments, referring to FIGS. 7 and 9C, the lower contact layer 230 may cover the upper surfaces of the plurality of conductive lines 220 and the upper surface of the lower insulating layer 210. The lower contact layer 230 may be in contact with the plurality of conductive lines 220 arranged in the first horizontal direction (X direction). In addition, the lower contact layer 230 may be in contact with lower surfaces of the plurality of crystalline oxide semiconductor layers 14 separated from each other in the first horizontal direction (X direction) and the second horizontal direction (Y direction).

In the semiconductor devices 2, 2-1, 2-2, 2-3, 2-4, and 2-5 according to the inventive concepts, the crystalline oxide semiconductor layer 14 functioning as a channel layer may have a high degree of crystallinity and be formed at a relatively low temperature. Therefore, the performance and the reliability of the semiconductor devices 2, 2-1, 2-2, 2-3, 2-4, and 2-5 may be improved.

FIGS. 10A to 10D are cross-sectional views showing a method of manufacturing a semiconductor device, according to example embodiments of the inventive concepts. Particularly, FIGS. 10A to 10D are cross-sectional views taken along line C-C' of FIG. 7.

Figure 10A:
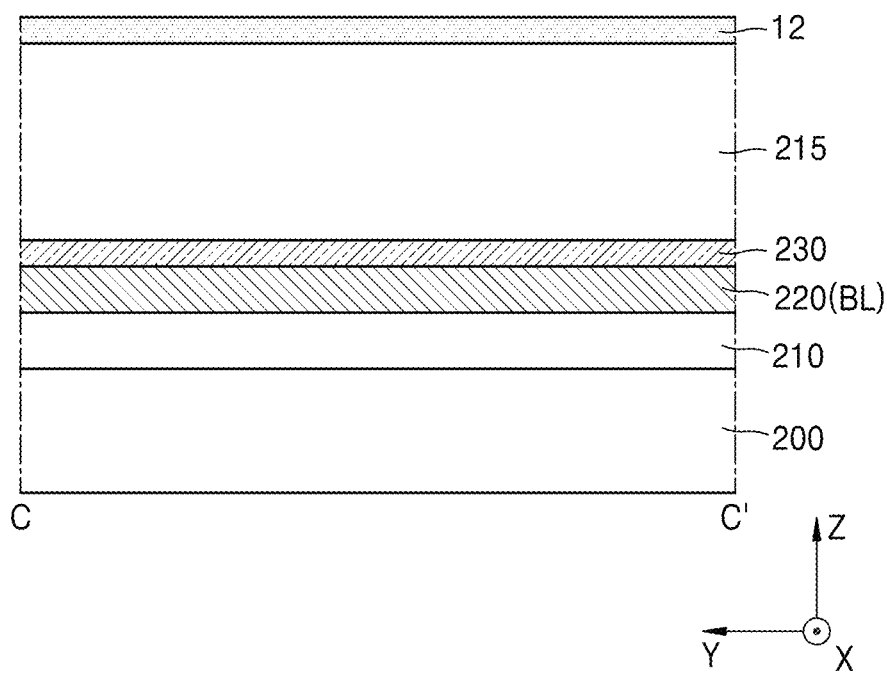
FIGS. 10A to 10D are cross-sectional views showing a method of manufacturing a semiconductor device, according to example embodiments of the inventive concepts.

Referring to FIG. 10A, the lower insulating layer 210, the plurality of conductive lines 220, the lower contact layer 230, the isolation insulating layer 215, and the seed oxide semiconductor layer 12 are formed on the substrate 200. For example, the lower insulating layer 210 may be formed on the substrate 200, and the conductive line 220 may be formed on the lower insulating layer 210. The plurality of conductive lines 220 may be formed to extend in the second horizontal direction (Y direction) and be separated from each other at equal intervals in the first horizontal direction (X direction). The lower insulating layer 210 may be formed to fill a space between conductive lines 220.

The lower contact layer 230 may be formed on the lower insulating layer 210 and the plurality of conductive lines 220. The plurality of lower contact layers 230 may be formed to extend in the second horizontal direction (Y direction) and be separated from each other at equal intervals in the first horizontal direction (X direction as shown in FIGS. 9A and 9B, or the lower contact layer 230 may be formed to cover the upper surfaces of the plurality of conductive lines 220 and the upper surface of the lower insulating layer 210 as shown in FIG. 9C.

The isolation insulating layer 215 may be formed on the lower contact layer 230. The isolation insulating layer 215 may be formed to have a thickness of tens of nm to hundreds nm. For example, the isolation insulating layer 215 may be formed to have a thickness of about 100 nm.

The seed oxide semiconductor layer 12 may be formed on the isolation insulating layer 215. In some example embodiments, by referring to the description made with reference to FIGS. 1B and 1C, the seed oxide semiconductor layer 12 may be formed by forming the preliminary seed oxide semiconductor layer 12P covering the isolation insulating layer 215 and then performing an annealing process. In some other example embodiments, when the seed oxide semiconductor layer 12 is formed to include a crystalline oxide semiconductor material, the annealing process may be omitted. In some example embodiments, the seed oxide semiconductor layer 12 may be formed to have a thickness of several nm to tens of nm. For example, the seed oxide semiconductor layer 12 may be formed to have a thickness of about 10 nm.

Figure 10B:
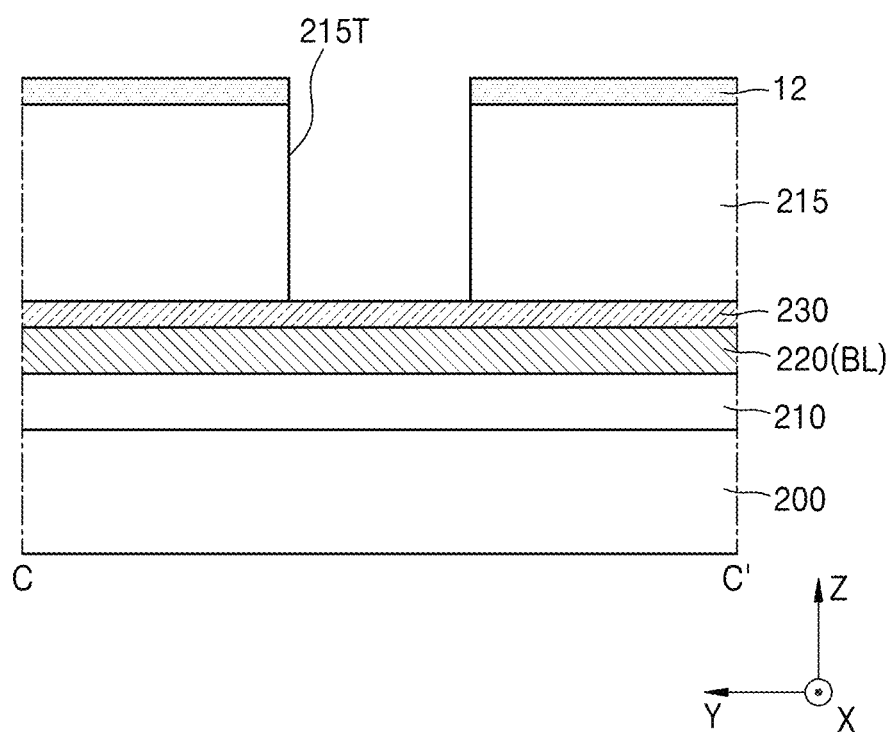

Referring to FIG. 10B, the channel trench 215T, through the bottom surface of which the lower contact layer 230 is exposed, may be formed by removing a part of the seed oxide semiconductor layer 12 and a part of the isolation insulating layer 215. For example, the channel trench 215T may be formed to expose the lower contact layer 230 through the bottom surface thereof by passing through the seed oxide semiconductor layer 12 and the isolation insulating layer 215. The channel trench 215T may be formed to extend long in the first horizontal direction (X direction). In some example embodiments, a horizontal width of the channel trench 215T may be tens of nm to hundreds of nm. For example, the horizontal width of the channel trench 215T may be about 100 nm.

Figure 10C:
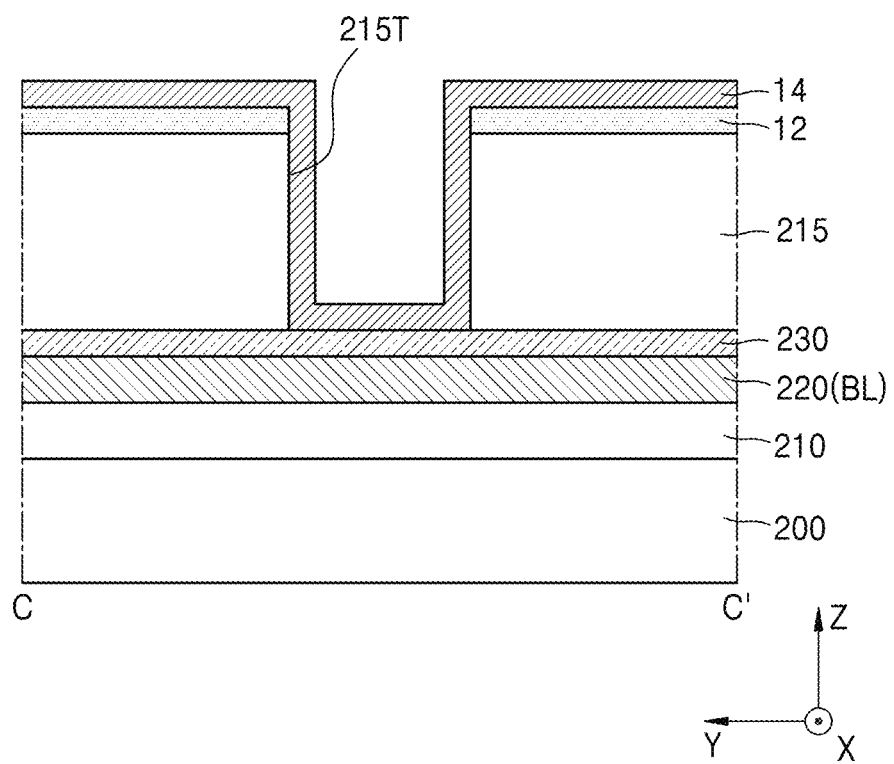

Referring to FIG. 10C, the crystalline oxide semiconductor layer 14 covering the upper surface of the seed oxide semiconductor layer 12 and an inner side surface and the bottom surface of the channel trench 215T is formed. In some example embodiments, by referring to the description made with reference to FIGS. 1E and 1F, the crystalline oxide semiconductor layer 14 may be formed by forming the preliminary crystalline oxide semiconductor layer 14P covering the upper surface of the seed oxide semiconductor layer 12 and the inner side surface and the bottom surface of the channel trench 215T and then performing an annealing process. In some example embodiments, the crystalline oxide semiconductor layer 14 may be formed to have a thickness of several nm to tens of nm. For example, the crystalline oxide semiconductor layer 14 may be formed to have a thickness of about 10 nm.

Figure 10D:
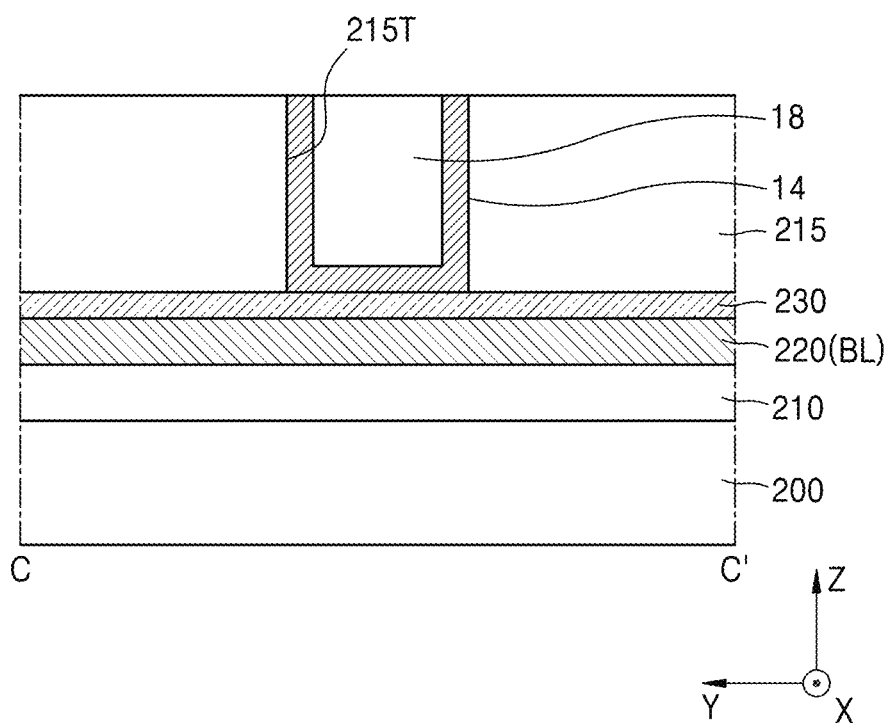

Referring to FIGS. 10C and 10D, a part of the crystalline oxide semiconductor layer 14 and the seed oxide semiconductor layer 12 are removed so that the isolation insulating layer 215 is exposed. In some example embodiments, a mold layer 18 filling the channel trench 215T may be formed before removing the part of the crystalline oxide semiconductor layer 14 and the seed oxide semiconductor layer 12, and then a CMP process may be performed until the isolation insulating layer 215 is exposed so that a part of an upper side of the crystalline oxide semiconductor layer 14 and the seed oxide semiconductor layer 12 are removed. In some example embodiments, after removing the part of the crystalline oxide semiconductor layer 14 and the seed oxide semiconductor layer 12, the mold layer 18 may be removed. In some other example embodiments, instead that the mold layer 18 is formed and then removed, before removing the part of the crystalline oxide semiconductor layer 14 and the seed oxide semiconductor layer 12, other components, e.g., the gate dielectric layer 240, the gate electrode 250, the barrier insulating layer 262, the gap-fill insulating layer 264, the gate capping pattern 266, and the like, disposed inside the channel trench 215T may be formed.

Thereafter, referring to FIGS. 7 to 9C, the upper contact layer 270 and the capacitor structure 290 may be formed to manufacture the semiconductor device 2, 2-1, 2-2, 2-3, 2-4, or 2-5.

Figure 11:
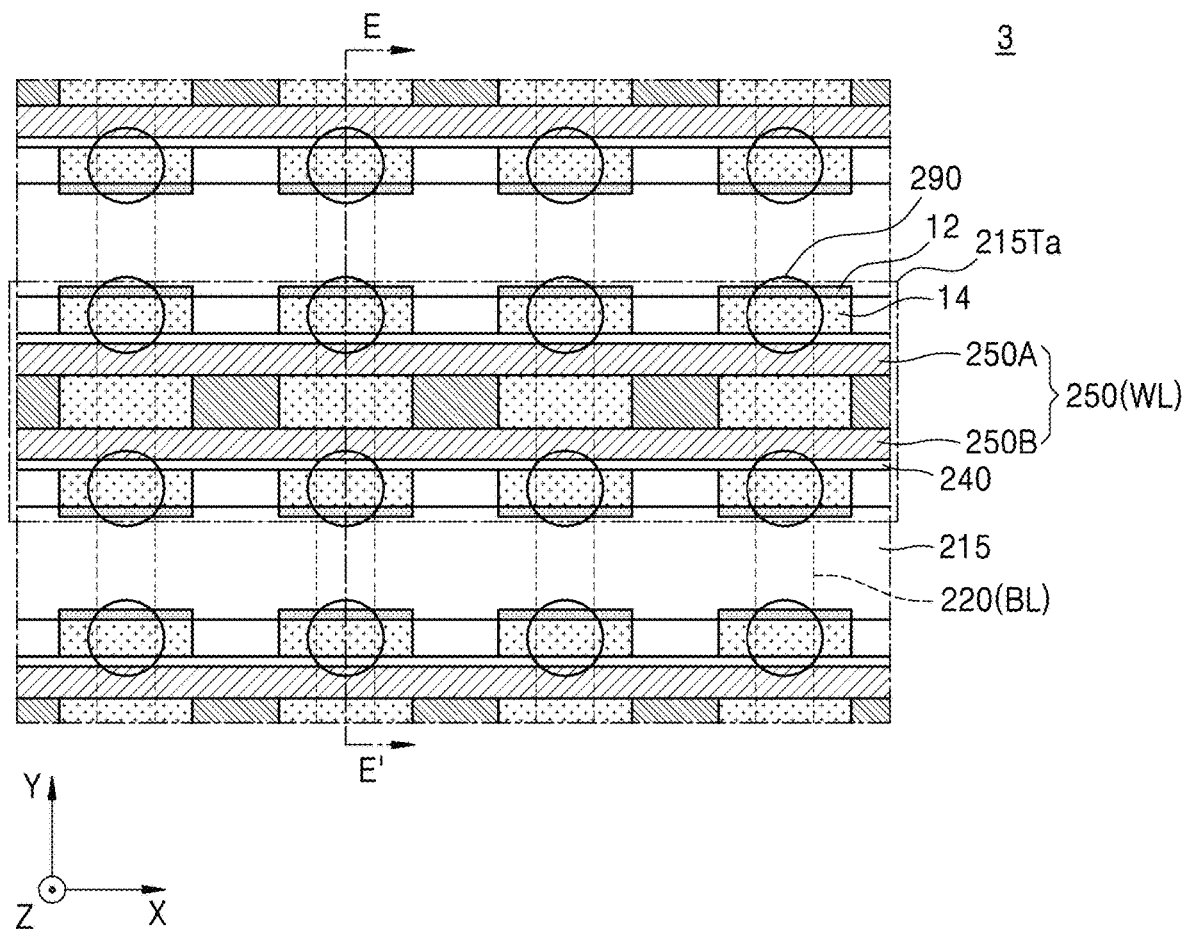
FIG. 11 is a layout diagram showing a semiconductor device according to example embodiments of the inventive concepts.
Figure 12A:
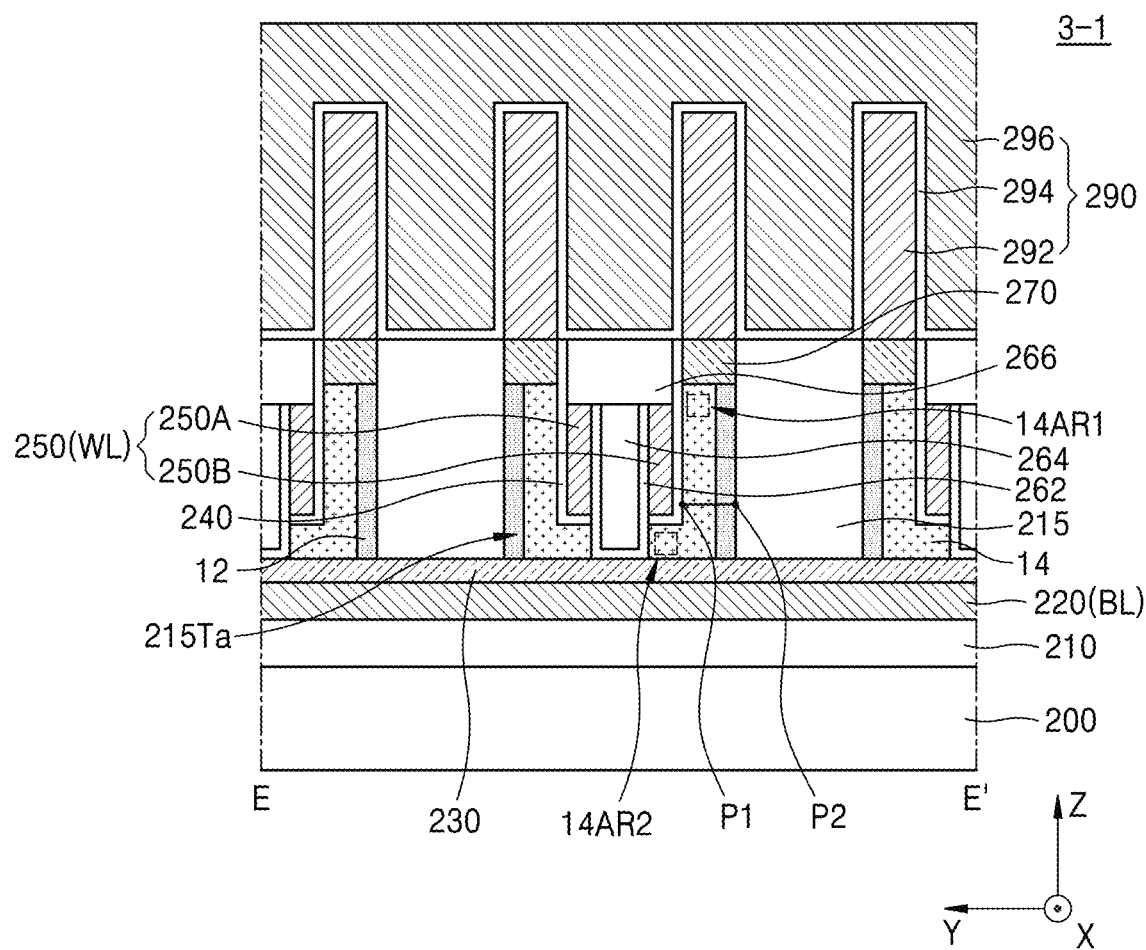
FIGS. 12A and 12B are cross-sectional views taken along line E-E' of FIG. 11.
Figure 12B:
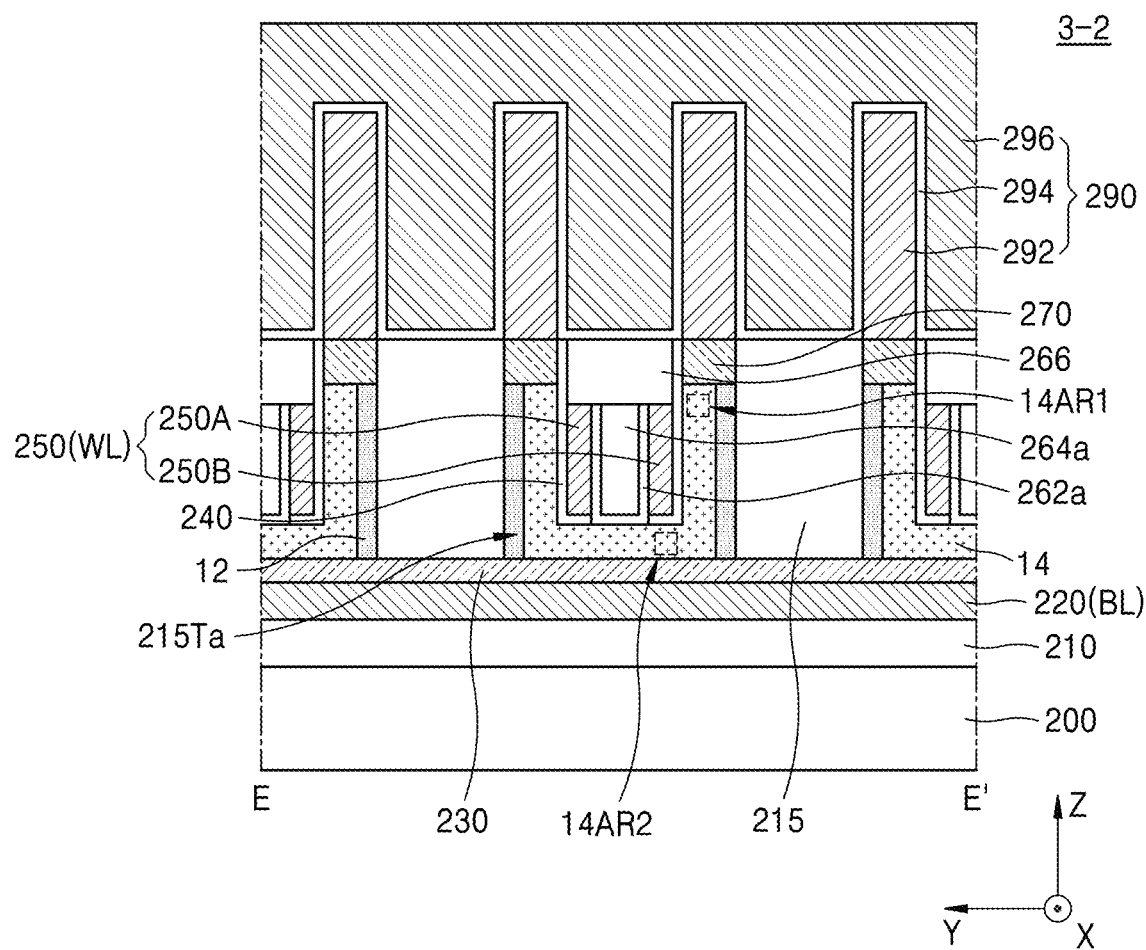

FIG. 11 is a layout diagram showing a semiconductor device 3 according to example embodiments of the inventive concepts, and FIGS. 12a and 12B are cross-sectional views taken along line E-E' of FIG. 11. Particularly, a cross-sectional view taken along line E-E' of the semiconductor device 3 shown in FIG. 11 may be a semiconductor device 3-1 shown in FIG. 12A or a semiconductor device 3-2 shown in FIG. 12B. For convenience of description, A description made with reference to FIGS. 7A to 9C is briefly repeated or omitted, and differences from the description made with reference to FIGS. 7A to 9C are mainly described.

Referring to FIGS. 11 to 12B, the semiconductor device 3, 3-1, or 3-2 may include the substrate 200, the conductive line 220 (BL), the lower contact layer 230, the isolation insulating layer 215, the crystalline oxide semiconductor layer 14, the gate dielectric layer 240, the gate electrode 250 (WL), the upper contact layer 270, and the capacitor structure 290.

Referring to FIGS. 11 and 12A, similarly to that shown in FIG. 8A, the semiconductor device 3 or 3-1 may include the barrier insulating layer 262 and the gap-fill insulating layer 264 between the first gate electrode 250A and the second gate electrode 250B.

Referring to FIGS. 11 and 12B, similarly to that shown in FIG. 8B, the semiconductor device 3 or 3-2 may include the barrier insulating layer 262a and the gap-fill insulating layer 264a between the first gate electrode 250A and the second gate electrode 250B.

Referring back to FIGS. 11 to 12B, the semiconductor device 3, 3-1, and 3-2 may further include the seed oxide semiconductor layer 12 between the isolation insulating layer 215 and the crystalline oxide semiconductor layer 14. For example, the seed oxide semiconductor layer 12 may extend along an outer side surface of the crystalline oxide semiconductor layer 14. The seed oxide semiconductor layer 12 may extend along the outer side surface of the crystalline oxide semiconductor layer 14 in the vertical direction (Z direction) between the upper contact layer 270 and the lower contact layer 230. A vertical height of the seed oxide semiconductor layer 12 may be substantially the same as a vertical height of the crystalline oxide semiconductor layer 14. In some example embodiments, the seed oxide semiconductor layer 12 may fully cover the outer side surface of the crystalline oxide semiconductor layer 14.

The first part 14AR1 and the second part 14AR2 of the crystalline oxide semiconductor layer 14 may have different crystallinities. The first part 14AR1 may be a part of the crystalline oxide semiconductor layer 14 adjacent to the seed oxide semiconductor layer 12, and the second part 14AR2 may be a part of the crystalline oxide semiconductor layer 14 farther from the seed oxide semiconductor layer 12 than the first part 14AR1, i.e., a part adjacent to the barrier insulating layer 262 or 262a and the gap-fill insulating layer 264 or 264a. For example, the first part 14AR1 may be a part adjacent to the outer side surface of the crystalline oxide semiconductor layer 14, and the second part 14AR2 may be a part adjacent to the lower surface of the crystalline oxide semiconductor layer 14. In some example embodiments, in the crystalline oxide semiconductor layer 14, the first part 14AR1 may have a higher degree of crystallinity than the second part 14AR2 as shown in FIG. 2. For example, in the crystalline oxide semiconductor layer 14, a grain size of the first part 14AR1 may be greater than a grain size of the second part 14AR2 as shown in FIG. 2.

Figure 13:
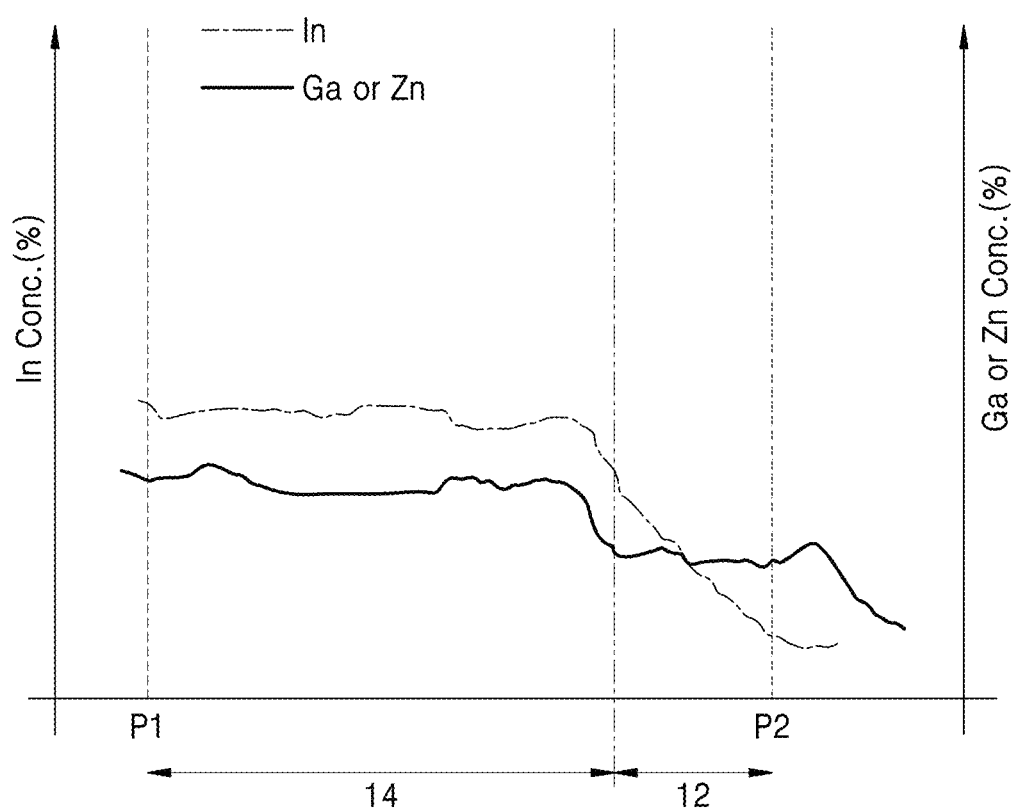
FIG. 13 is a graph showing a crystalline oxide semiconductor layer included in a semiconductor device, according to example embodiments of the inventive concepts.

FIG. 13 is a graph showing a crystalline oxide semiconductor layer included in a semiconductor device, according to example embodiments of the inventive concepts.

Referring to FIGS. 12A and 13, the seed oxide semiconductor layer 12 may include a ternary oxide semiconductor material including a first metal element and a second metal element that are different from each other, and the crystalline oxide semiconductor layer 14 may include a quaternary oxide semiconductor material including the first meatal element, the second metal element, and a third metal element that is different from the first meatal element and the second metal element. A density of the third metal element in the seed oxide semiconductor layer 12 may gradually decrease away from the crystalline oxide semiconductor layer 14.

FIG. 13 is an example showing schematic densities of gallium (Ga) or zinc (Zn) and indium (In) on a scan line connecting from one point P1 of the crystalline oxide semiconductor layer 14 in contact with the gate dielectric layer 240 to one point P2 of the seed oxide semiconductor layer 12 in contact with the isolation insulating layer 215 when the seed oxide semiconductor layer 12 includes GZO or $Ga_xZn_yO$ and the crystalline oxide semiconductor layer 14 includes IGZO or $In_xGa_yZn_zO$.

For example, as shown in FIG. 13, the density of the third metal element (e.g., In) in the seed oxide semiconductor layer 12 may gradually decrease away from the crystalline oxide semiconductor layer 14. This may be because the third metal element in the crystalline oxide semiconductor layer 14 spreads to the seed oxide semiconductor layer 12.

In a direction away from the crystalline oxide semiconductor layer 14, a density decrease rate of the third metal element (e.g., In) in the seed oxide semiconductor layer 12 may be greater than a density decrease rate of the first metal element (e.g., Ga) or the second metal element (e.g., Zn) in the seed oxide semiconductor layer 12. For example, a density of the first metal element (e.g., Ga) or the second metal element (e.g., Zn) in the seed oxide semiconductor layer 12 may be maintained to be substantially constant in the direction away from the crystalline oxide semiconductor layer 14.

Although FIG. 13 shows that a density of the third metal element (e.g., In) in the crystalline oxide semiconductor layer 14 is higher than a density of the first metal element (e.g., Ga) or the second metal element (e.g., Zn) in the crystalline oxide semiconductor layer 14, this is only illustrative. In addition, although FIG. 13 shows that the density of the first metal element (e.g., Ga) or the second metal element (e.g., Zn) in the seed oxide semiconductor layer 12 is lower than the density of the first metal element (e.g., Ga) or the second metal element (e.g., Zn) in the crystalline oxide semiconductor layer 14, this is only illustrative.

FIGS. 14A to 14E are cross-sectional views showing a method of manufacturing a semiconductor device, according to example embodiments of the inventive concepts. Particularly, FIGS. 14A to 14E are cross-sectional views taken along line E-E' of FIG. 11.

Figure 14A:
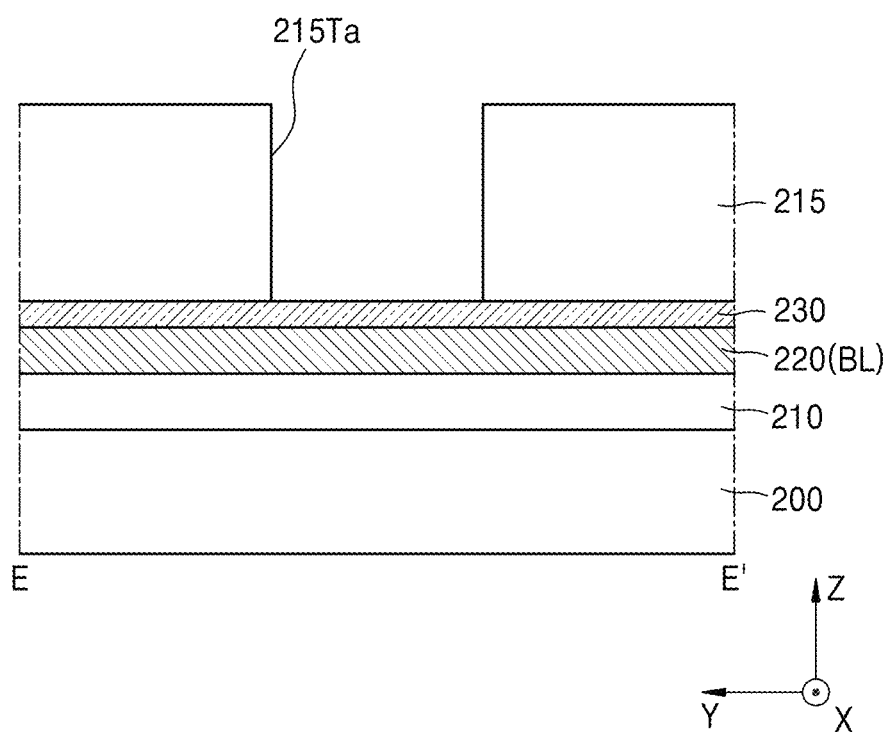
FIGS. 14A to 14E are cross-sectional views showing a method of manufacturing a semiconductor device, according to example embodiments of the inventive concepts.

Referring to FIG. 14A, a channel trench 215Ta, through a bottom surface of which the lower contact layer 230 is exposed, may be formed by forming the lower insulating layer 210, the plurality of conductive lines 220, the lower contact layer 230, and the isolation insulating layer 215 on the substrate 200 and then removing a part of the isolation insulating layer 215. For example, the channel trench 215Ta may be formed to expose the lower contact layer 230 through the bottom surface thereof by passing through the isolation insulating layer 215. The channel trench 215Ta may be formed to extend long in the first horizontal direction (X direction). In some embodiments, a horizontal width of the channel trench 215Ta may be tens of nm to hundreds of nm. For example, the horizontal width of the channel trench 215Ta may be about 100 nm.

Figure 14B:
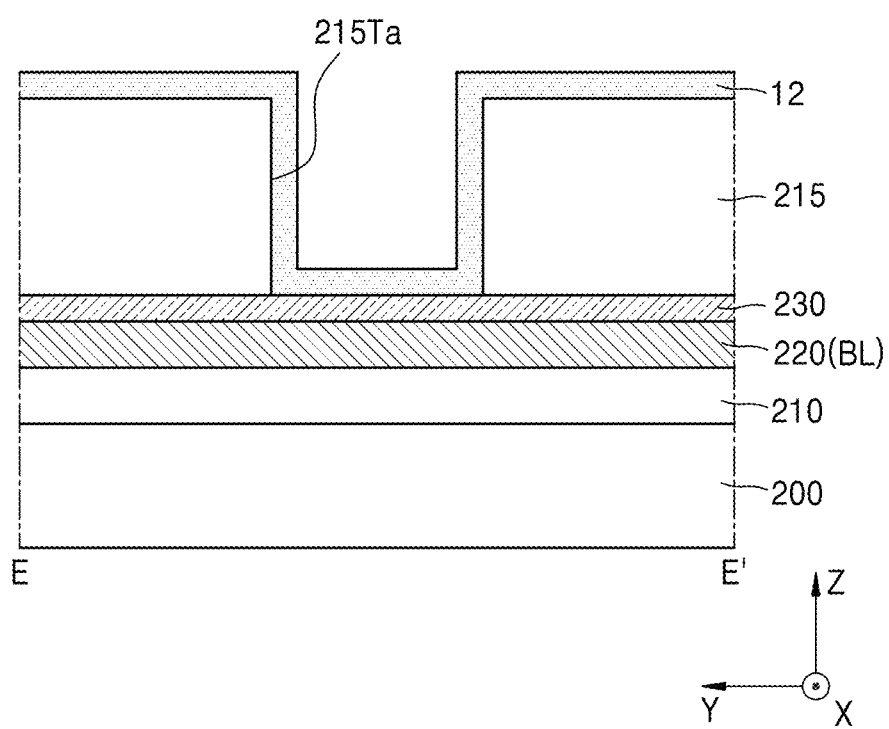

Referring to FIG. 14B, the seed oxide semiconductor layer 12 covering the upper surface of the isolation insulating layer 215 and an inner side surface and a bottom surface of the channel trench 215Ta is formed. In some embodiments, by referring to the description made with reference to FIGS. 1B and 1C, the seed oxide semiconductor layer 12 may be formed by forming the preliminary seed oxide semiconductor layer 12P covering the upper surface of the isolation insulating layer 215 and the inner side surface and the bottom surface of the channel trench 215Ta and then performing an annealing process. In some other embodiments, when the seed oxide semiconductor layer 12 is formed to include a crystalline oxide semiconductor material, the annealing process may be omitted.

Figure 14C:
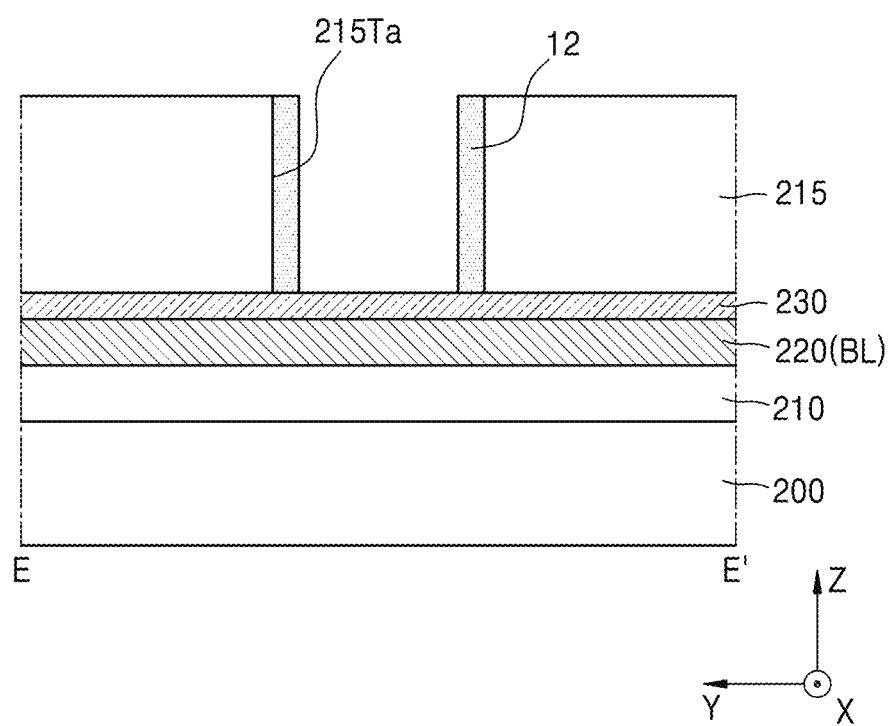

Referring to FIG. 14C, a part of the seed oxide semiconductor layer 12 covering the upper surface of the isolation insulating layer 215 and the bottom surface of the channel trench 215Ta is removed. The remaining part of the seed oxide semiconductor layer 12 may have a spacer shape covering the inner side surface of the channel trench 215Ta. In some embodiments, an etch-back process may be performed to remove the part of the seed oxide semiconductor layer 12 covering the upper surface of the isolation insulating layer 215 and the bottom surface of the channel trench 215Ta. In some other embodiments, a photo process and an etching process may be performed to remove the part of the seed oxide semiconductor layer 12 covering the upper surface of the isolation insulating layer 215 and the bottom surface of the channel trench 215Ta.

Figure 14D:
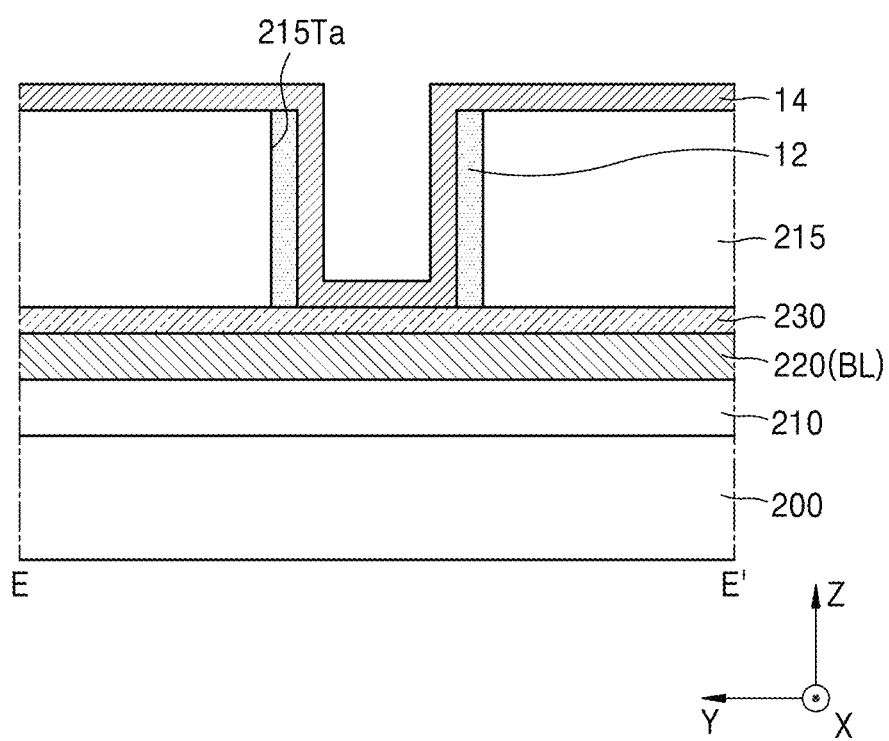

Referring to FIG. 14D, the crystalline oxide semiconductor layer 14 covering the upper surface of the isolation insulating layer 215, the bottom surface of the channel trench 215Ta, and the seed oxide semiconductor layer 12 on the inner side surface of the channel trench 215Ta is formed.

In some embodiments, by referring to the description made with reference to FIGS. 1E and 1F, the crystalline oxide semiconductor layer 14 may be formed by forming the preliminary crystalline oxide semiconductor layer 14P covering the upper surface of the isolation insulating layer 215, the bottom surface of the channel trench 215Ta, and the seed oxide semiconductor layer 12 on the inner side surface of the channel trench 215Ta and then performing an annealing process.

Figure 14E:
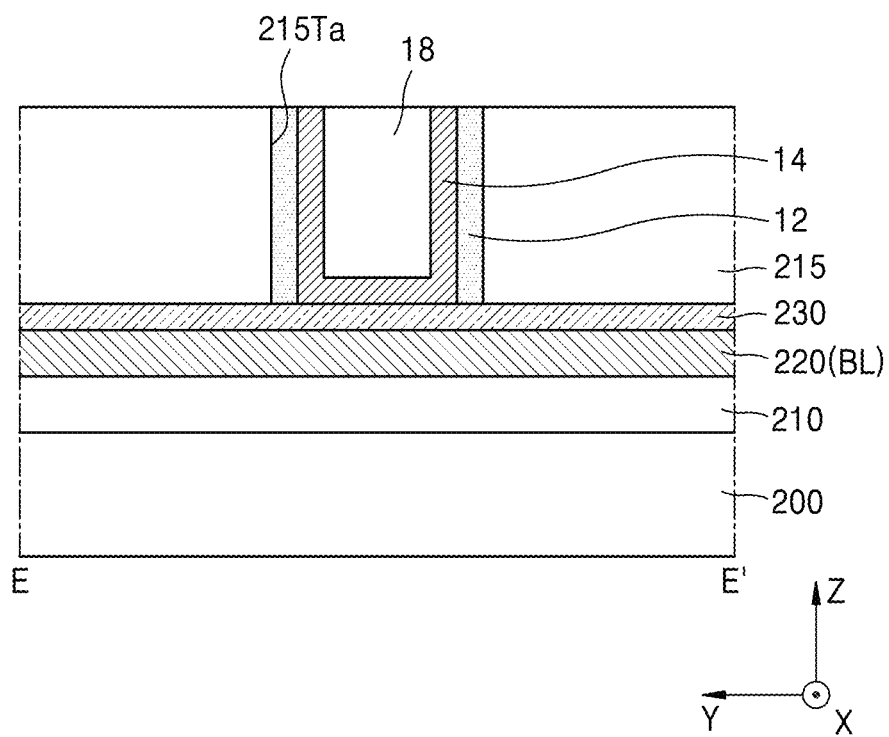

Referring to FIGS. 14D and 14E, a part of the crystalline oxide semiconductor layer 14 is removed so that the isolation insulating layer 215 is exposed. In some embodiments, the mold layer 18 filling the channel trench 215Ta may be formed before removing the part of the crystalline oxide semiconductor layer 14, and then a CMP process may be performed until the isolation insulating layer 215 is exposed so that a part of an upper side of the crystalline oxide semiconductor layer 14 is removed. In some embodiments, after removing the part of the crystalline oxide semiconductor layer 14, the mold layer 18 may be removed. In some other embodiments, instead that the mold layer 18 is formed and then removed, before removing the part of the crystalline oxide semiconductor layer 14, other components, e.g., the gate dielectric layer 240, the gate electrode 250, the barrier insulating layer 262, the gap-fill insulating layer 264, the gate capping pattern 266, and the like, disposed inside the channel trench 215Ta may be formed.

Thereafter, referring to FIGS. 11 to 12B, the upper contact layer 270 and the capacitor structure 290 may be formed to manufacture the semiconductor device 3, 3-1, or 3-2.

While the inventive concepts have been particularly shown and described with reference to embodiments thereof, it will be understood that various changes in form and details may be made therein without departing from the spirit and scope of the following claims.

What is claimed is:

1. A semiconductor device comprising:
a substrate;
a conductive line extending on the substrate in a first horizontal direction;
an isolation insulating layer extending on the substrate and the conductive line in a second horizontal direction intersecting with the first horizontal direction, and defining a channel trench extending through the isolation insulating layer from an upper surface of the isolation insulating layer to a lower surface of the isolation insulating layer;
a crystalline oxide semiconductor layer extending along at least a portion of an inner side surface of the channel trench and at least a portion of a bottom surface of the channel trench and contacting the conductive line; and
a gate electrode extending on the crystalline oxide semiconductor layer inside the channel trench in the second horizontal direction,
wherein, in the crystalline oxide semiconductor layer, a grain size of a first part of the crystalline oxide semiconductor layer adjacent to the inner side surface of the channel trench is greater than a grain size of a second part of the crystalline oxide semiconductor layer adjacent to the bottom surface of the channel trench.

2. The semiconductor device of claim 1, wherein
the gate electrode comprises a first gate electrode and a second gate electrode, the second gate electrode being separated from the first gate electrode and facing the first gate electrode in the first horizontal direction, and the second gate electrode extending in the second horizontal direction inside the channel trench, and
the semiconductor device further comprises:
a barrier insulating layer between the first gate electrode and the second gate electrode; and
a gap-fill insulating layer formed on the barrier insulating layer and in a region between the first gate electrode and the second gate electrode.

3. The semiconductor device of claim 2, wherein a lowermost surface of the barrier insulating layer is lower than or equal to a lowermost surface of the crystalline oxide semiconductor layer.

4. The semiconductor device of claim 2, wherein a lowermost surface of the barrier insulating layer is higher than a lowermost surface of the crystalline oxide semiconductor layer.

5. The semiconductor device of claim 2, further comprising a seed oxide semiconductor layer between the isolation insulating layer and the crystalline oxide semiconductor layer and extending along an outer side surface of the crystalline oxide semiconductor layer.

6. The semiconductor device of claim 5, wherein the first part is adjacent to the seed oxide semiconductor layer, and the second part is adjacent to the barrier insulating layer.

7. The semiconductor device of claim 5, wherein the seed oxide semiconductor layer includes a binary or ternary crystalline oxide semiconductor material, and the crystalline oxide semiconductor layer includes a quaternary oxide semiconductor material.

8. The semiconductor device of claim 5, wherein the seed oxide semiconductor layer includes a binary oxide semiconductor material including a first metal element, or a ternary crystalline oxide semiconductor material including the first metal element and a second metal element that is different from the first metal element, and the crystalline oxide semiconductor layer includes a quaternary oxide semiconductor material including the first metal element, the second metal element, and a third metal element that is different from the first metal element and the second metal element.

9. The semiconductor device of claim 1, wherein the first part is an upper part of the crystalline oxide semiconductor layer, and the second part is a lower part of the crystalline oxide semiconductor layer.

10. The semiconductor device of claim 1, further comprising:
a capacitor structure on the isolation insulating layer; and
an upper contact layer between the crystalline oxide semiconductor layer and the capacitor structure.

11. A semiconductor device comprising:
a substrate;
a filling oxide layer on the substrate;
a plurality of conductive lines extending in a first horizontal direction with a side surface of each of the plurality of conductive lines covered by the filling oxide layer, and arranged to be separated from each other in a second horizontal direction intersecting with the first horizontal direction;
a lower contact layer on the plurality of conductive lines;
an isolation insulating layer extending on the filling oxide layer and the lower contact layer in the second horizontal direction intersecting with the first horizontal direction, and defining a channel trench through a bottom surface of the isolation insulating layer exposing at least a portion of the lower contact layer;
a crystalline oxide semiconductor layer extending along at least a portion of an inner side surface of the channel trench and at least a portion of the bottom surface of the channel trench and contacting the plurality of conductive lines;
a gate electrode comprising first gate electrode and second gate electrode separated from the first gate electrode and facing the first gate electrode on the crystalline oxide semiconductor layer inside the channel trench in the first horizontal direction and the first gate electrode and the second gate electrode extending in the second horizontal direction;
an upper contact layer on the crystalline oxide semiconductor layer; and
a capacitor structure on the isolation insulating layer and the upper contact layer and contacting an upper surface of the upper contact layer,
wherein an upper part of the crystalline oxide semiconductor layer has a larger grain size than a lower part of the crystalline oxide semiconductor layer.

12. The semiconductor device of claim 11, wherein a plurality of lower contact layers are arranged in the second horizontal direction, and the plurality of lower contact layers are separated from each other by an upper insulating layer covering at least a part of an upper surface of the lower insulating layer.

13. The semiconductor device of claim 11, further comprising:
the filling oxide layer on the lower insulating layer; and
a side insulating layer between each of the plurality of conductive lines and the filling oxide layer and covering a side surface of each of the plurality of conductive lines.

14. The semiconductor device of claim 11, wherein the lower contact layer covers an upper surface of each of the plurality of conductive lines and an upper surface of the lower insulating layer.

15. The semiconductor device of claim 11, further comprising:
a barrier insulating layer between the first gate electrode and the second gate electrode; and
a gap-fill insulating layer formed on the barrier insulating layer and on a region between the first gate electrode and the second gate electrode.

16. The semiconductor device of claim 15, wherein the barrier insulating layer contacts the lower contact layer.

17. The semiconductor device of claim 15, wherein the barrier insulating layer contacts the crystalline oxide semiconductor layer and does not contact the lower contact layer.

18. A semiconductor device comprising:
a substrate;
a filling oxide layer on the substrate;
a plurality of conductive lines extending in a first horizontal direction with each of the plurality of conductive lines including a side surface covered by the filling oxide layer, and the plurality of conductive lines being arranged by being separated from each other in a second horizontal direction intersecting with the first horizontal direction;
a lower contact layer on the plurality of conductive lines;
an isolation insulating layer extending on the filling oxide layer and the lower contact layer in the second horizontal direction intersecting with the first horizontal direction, and defining a channel trench through a bottom surface of the isolation insulating layer and exposing at least a portion of the lower contact layer;
a crystalline oxide semiconductor layer extending along at least a portion of an inner side surface of the channel trench and at least a portion of the bottom surface of the channel trench and contacting the plurality of conductive lines;
a seed oxide semiconductor layer between the isolation insulating layer and the crystalline oxide semiconductor layer and extending along an outer side surface of the crystalline oxide semiconductor layer;
a gate electrode comprising first gate electrode and second gate electrode separated from the first gate electrode and facing the first gate electrode on the crystalline oxide semiconductor layer inside the channel trench in the first horizontal direction and the first gate electrode and the second gate electrode extending in the second horizontal direction;
a barrier insulating layer between the first gate electrode and second gate electrode, and a gap-fill insulating layer formed on the barrier insulating layer in a region between the first gate electrode and the second gate electrode;
an upper contact layer on the crystalline oxide semiconductor layer; and
a capacitor structure on the isolation insulating layer and the upper contact layer and contacting an upper surface of the upper contact layer,
wherein a first part of the crystalline oxide semiconductor layer adjacent to the seed oxide semiconductor layer has a larger grain size than a second part of the crystalline oxide semiconductor layer adjacent to the barrier insulating layer.

19. The semiconductor device of claim 18, wherein the seed oxide semiconductor layer includes a gallium zinc oxide (GZO), and the crystalline oxide semiconductor layer includes an indium gallium zinc oxide (IGZO).

20. The semiconductor device of claim 18, wherein a first vertical height of the crystalline oxide semiconductor layer is substantially the same as a second vertical height of the seed oxide semiconductor layer.

* * * * *